United States Patent
Nakamura

(10) Patent No.: US 12,255,632 B2
(45) Date of Patent: *Mar. 18, 2025

(54) ACOUSTIC WAVE DEVICE, AND LADDER FILTER INCLUDING THE SAME

(71) Applicant: Murata Manufacturing Co., Ltd., Nagaokakyo (JP)

(72) Inventor: Kentaro Nakamura, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 285 days.

This patent is subject to a terminal disclaimer.

(21) Appl. No.: 17/869,809

(22) Filed: Jul. 21, 2022

(65) Prior Publication Data

US 2022/0360252 A1 Nov. 10, 2022

Related U.S. Application Data

(63) Continuation of application No. PCT/JP2021/003252, filed on Jan. 29, 2021.

(30) Foreign Application Priority Data

Jan. 31, 2020 (JP) .................. 2020-015067

(51) Int. Cl.
- *H03H 9/56* (2006.01)
- *H03H 9/02* (2006.01)
- *H03H 9/145* (2006.01)

(52) U.S. Cl.
CPC ........ *H03H 9/568* (2013.01); *H03H 9/02771* (2013.01); *H03H 9/02992* (2013.01); *H03H 9/14541* (2013.01)

(58) Field of Classification Search
CPC ............... H03H 9/568; H03H 9/02771; H03H 9/02992; H03H 9/14541; H03H 9/14547;
(Continued)

(56) References Cited

U.S. PATENT DOCUMENTS

| | | |
|---|---|---|
| 2007/0046399 A1 | 3/2007 | Yoneya |
| 2011/0032051 A1 | 2/2011 | Kawamoto et al. |

(Continued)

FOREIGN PATENT DOCUMENTS

| | | |
|---|---|---|
| JP | 6397004 A | 4/1988 |
| JP | 02250413 A | 10/1990 |

(Continued)

OTHER PUBLICATIONS

International Search Report in PCT/JP2021/003252, mailed Mar. 30, 2021, 4 pages.

(Continued)

*Primary Examiner* — Jorge L Salazar, Jr.
(74) *Attorney, Agent, or Firm* — Keating & Bennett, LLP

(57) ABSTRACT

An acoustic wave device includes a substrate including a piezoelectric layer, first and second resonators on the substrate, and a shared reflector. The second resonator is located on the substrate adjacent to the first resonator and has different frequency characteristics than the first resonator. The shared reflector is located on the substrate between the first resonator and the second resonator and is a reflector for both the first resonator and the second resonator. The first resonator includes a first interdigital transducer electrode with electrode fingers positioned with a first pitch. The second resonator includes a second interdigital transducer electrode with electrode fingers positioned with a second pitch. A lower limit frequency of a stop band of the shared reflector is between a lower limit frequency of a stop band of the first resonator and a lower limit frequency of a stop band of the second resonator. An upper limit frequency of the stop band of the shared reflector is between an upper limit frequency of the stop band of the first resonator and an upper limit frequency of the stop band of the second resonator.

20 Claims, 18 Drawing Sheets

(58) Field of Classification Search
CPC ............. H03H 9/6483; H03H 9/02574; H03H 9/02842
USPC ........................................ 333/133, 193–196
See application file for complete search history.

(56) References Cited

U.S. PATENT DOCUMENTS

| | | |
|---|---|---|
| 2014/0218129 A1 | 8/2014 | Fujiwara et al. |
| 2019/0190487 A1 | 6/2019 | Yasuda |
| 2020/0220518 A1 | 7/2020 | Omura |
| 2021/0265970 A1* | 8/2021 | Yamaji ............... H03H 9/02842 |

FOREIGN PATENT DOCUMENTS

| | | | |
|---|---|---|---|
| JP | 03283710 | A | 12/1991 |
| JP | 10303691 | A | 11/1998 |
| JP | 2007060331 | A | 3/2007 |
| JP | 2009273120 | A | 11/2009 |
| JP | 2017153132 | A | 8/2017 |
| WO | 2018043496 | A1 | 3/2018 |
| WO | 2019065666 | A1 | 4/2019 |

OTHER PUBLICATIONS

Written Opinion in PCT/JP2021/003252, mailed Mar. 30, 2021, 8 pages.

\* cited by examiner

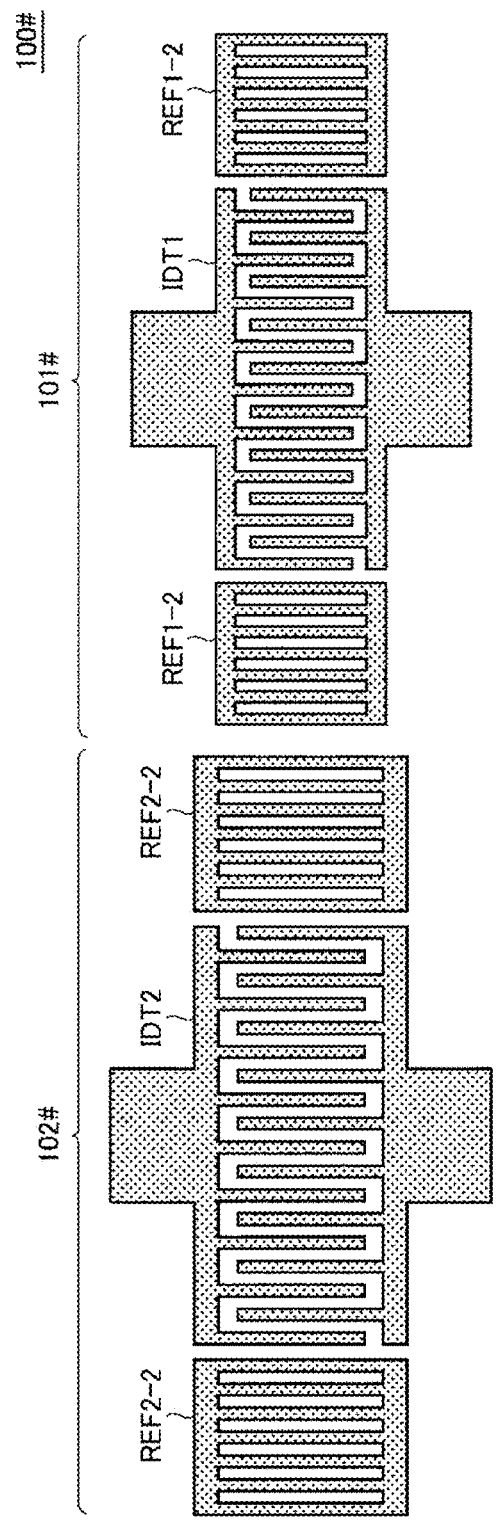
FIG.4 COMPARATIVE EXAMPLE

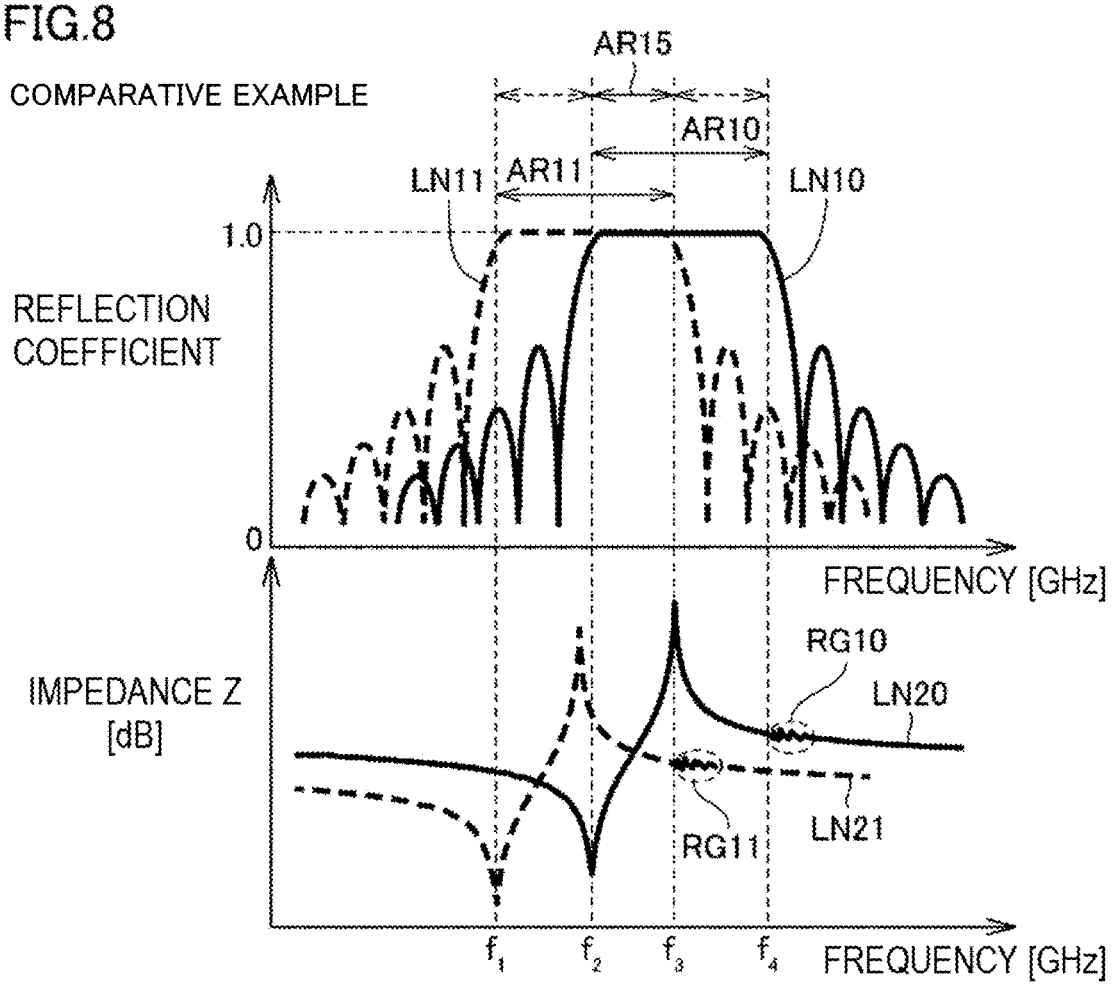

FIG.10

|  | RESONATOR 2 | | SHARED REFLECTOR | RESONATOR 1 | |
|---|---|---|---|---|---|
|  | IDT | REFLECTOR | | REFLECTOR | IDT |
| NUMBER OF PAIRS OF ELECTRODE FINGERS OF IDT | 90 | — | — | — | 130 |
| OVERLAP WIDTH [μm] | 50.59 | — | 50.59 | — | 25.29 |
| WAVELENGTH λ [μm] | 1.60700 | 1.60700 | 1.5495~1.60700 | 1.5495 | 1.5495 |
| NUMBER OF ELECTRODE FINGERS OF IDT | 181 | 10 | 8 | 10 | 261 |
| DUTY | 0.5 | 0.5 | 0.5 | 0.5 | 0.5 |
| RESONANT FREQUENCY [MHz] | 2358.11 | | — | 2453.39 | |

FIG.14

|  | RESONATOR 2 | | SHARED REFLECTOR | RESONATOR 1 | |
|---|---|---|---|---|---|
|  | IDT | REFLECTOR | | REFLECTOR | IDT |
| NUMBER OF PAIRS OF ELECTRODE FINGERS OF IDT | 130 | — | — | — | 130 |
| OVERLAP WIDTH [μm] | 35.0 | — | 35.0 | — | 25.29 |
| WAVELENGTH λ [μm] | 1.5495 | 1.5495 | 1.5495 | 1.5495 | 1.5495 |
| NUMBER OF ELECTRODE FINGERS OF IDT | 261 | 10 | 8 | 10 | 261 |
| DUTY | 0.55 | 0.55 | 0.55~0.5 | 0.5 | 0.5 |
| RESONANT FREQUENCY [MHz] | 2446.86 | | — | 2453.39 | |

FIG.16

|  | RESONATOR 2 | | SHARED REFLECTOR | RESONATOR 1 | |
| --- | --- | --- | --- | --- | --- |
|  | IDT | REFLECTOR |  | REFLECTOR | IDT |
| NUMBER OF PAIRS OF ELECTRODE FINGERS OF IDT | 90 | — | — | — | 130 |
| OVERLAP WIDTH [μm] | 35.0 | — | 35.0 | — | 25.29 |
| WAVELENGTH λ [μm] | 1.5495 | 1.5495 | 1.5495 | 1.5495 | 1.5495 |
| NUMBER OF ELECTRODE FINGERS OF IDT | 181 | 10 | 8 | 10 | 261 |
| ELECTRODE FINGER FILM THICKNESS [nm] | 131 | | 131~121 | 121 | |
| DUTY | 0.5 | 0.5 | 0.5 | 0.5 | 0.5 |
| RESONANT FREQUENCY [MHz] | 2442.24 | | — | 2453.39 | |

ACOUSTIC WAVE DEVICE, AND LADDER FILTER INCLUDING THE SAME

CROSS REFERENCE TO RELATED APPLICATIONS

This application claims the benefit of priority to Japanese Patent Application No. 2020-015067 filed on Jan. 31, 2020 and is a Continuation Application of PCT Application No. PCT/JP2021/003252 filed on Jan. 29, 2021. The entire contents of each application are hereby incorporated herein by reference.

BACKGROUND OF THE INVENTION

1. Field of the Invention

The present disclosure relates to an acoustic wave device and a ladder filter including the same and, more specifically, to a technology for reducing the size of an acoustic wave device.

2. Description of the Related Art

Japanese Unexamined Patent Application Publication No. 10-303691 describes a filter device made up of a plurality of surface acoustic wave (SAW) resonators. Generally, in such a filter device, to reduce leakage of signals, to be propagated through the surface acoustic wave resonators, from the resonators, reflectors are disposed on both sides of an interdigital transducer (IDT) electrode that is a component of each of the surface acoustic wave resonators.

SUMMARY OF THE INVENTION

Filter devices that use surface acoustic wave resonators as described above can be used in mobile terminals, typically, for example, mobile phones or smartphones. In mobile terminals, there are still great needs for size reduction and thickness reduction, and, accordingly, devices, such as filter devices, that are components of the mobile terminals are also desired for further size reduction and low profile.

For such an inconvenience, for example, Japanese Unexamined Patent Application Publication No. 2002-176335 suggests a configuration in which the overall size of an acoustic wave device is reduced by sharing a reflector disposed between interdigital transducer electrodes of adjacent surface acoustic wave resonators. However, depending on the configuration of the device, the frequency characteristics of adjacent surface acoustic wave resonators are different from each other, so just simply sharing the reflector may lead to a decrease in the frequency characteristics of the overall device on the contrary, and desired characteristics are possibly not able to be implemented.

Preferred embodiments of the present invention provide acoustic wave devices each including a plurality of resonators, and achieving size reduction while preventing any negative impact on the frequency characteristics of the device.

An acoustic wave device according to a first aspect of a preferred embodiment of the present disclosure includes a substrate including a piezoelectric layer, first and second resonators on the substrate, and a shared reflector. The second resonator is on the substrate adjacent to the first resonator and has different frequency characteristics than the first resonator. The shared reflector is on the substrate between the first resonator and the second resonator and is a reflector for both the first resonator and the second resonator. The first resonator includes a first interdigital transducer electrode including electrode fingers positioned with a first pitch. The second resonator includes a second interdigital transducer electrode including electrode fingers positioned with a second pitch. A lower limit frequency of a stop band of the shared reflector is equal to both a lower limit frequency of a stop band of the first resonator and a lower limit frequency of a stop band of the second resonator, or between the lower limit frequency of the stop band of the first resonator and the lower limit frequency of the stop band of the second resonator. An upper limit frequency of the stop band of the shared reflector is equal to both an upper limit frequency of the stop band of the first resonator and an upper limit frequency of the stop band of the second resonator, or between the upper limit frequency of the stop band of the first resonator and the upper limit frequency of the stop band of the second resonator.

An acoustic wave device according to a second aspect of a preferred embodiment of the present disclosure includes a substrate including a piezoelectric layer, first and second resonators on the substrate, and a shared reflector. The second resonator is on the substrate adjacent to the first resonator and has different frequency characteristics than the first resonator. The shared reflector is on the substrate between the first resonator and the second resonator and is a reflector for both the first resonator and the second resonator. The first resonator includes a first interdigital transducer electrode including electrode fingers positioned with a first pitch. The second resonator includes a second interdigital transducer electrode including electrode fingers positioned with a second pitch. Where values obtained by multiplying a pitch of electrode fingers, a duty of the electrode fingers, and a thickness of the electrode fingers for the shared reflector, the first resonator, and the second resonator are respectively a first value, a second value, and a third value, the first value is the same as both the second value and the third value or between the second value and the third value.

With an acoustic wave device according to a preferred embodiment of the present disclosure, between two acoustic wave resonators (the first resonator and the second resonator) each including the interdigital transducer electrode, the shared reflector that is a reflector for both resonators is provided. The lower limit frequency of the stop band of the shared reflector is between the lower limit frequencies of the stop bands of the two resonators, and the upper limit frequency of the stop band of the shared reflector is between the upper limit frequencies of the stop bands of the two resonators. With such a configuration, a signal from the interdigital transducer of any one of the resonators is reflected by the shared reflector. Therefore, it is possible to reduce the size while preventing any negative impact on the frequency characteristics of the acoustic wave device.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4 is a top view of an acoustic wave device of a comparative example.

FIG. 8 is a graph for illustrating the frequency characteristics of the acoustic wave device of the comparative example.

FIG. 10 is a table showing an example of the specifications of the acoustic wave device according to the first preferred embodiment of the present invention.

FIG. 14 is a table showing an example of the specifications of the acoustic wave device according to the second preferred embodiment of the present invention.

FIG. 16 is a table showing an example of the specifications of the acoustic wave device according to the third preferred embodiment of the present invention.

DETAILED DESCRIPTION OF THE PREFERRED EMBODIMENTS

Figure 1:
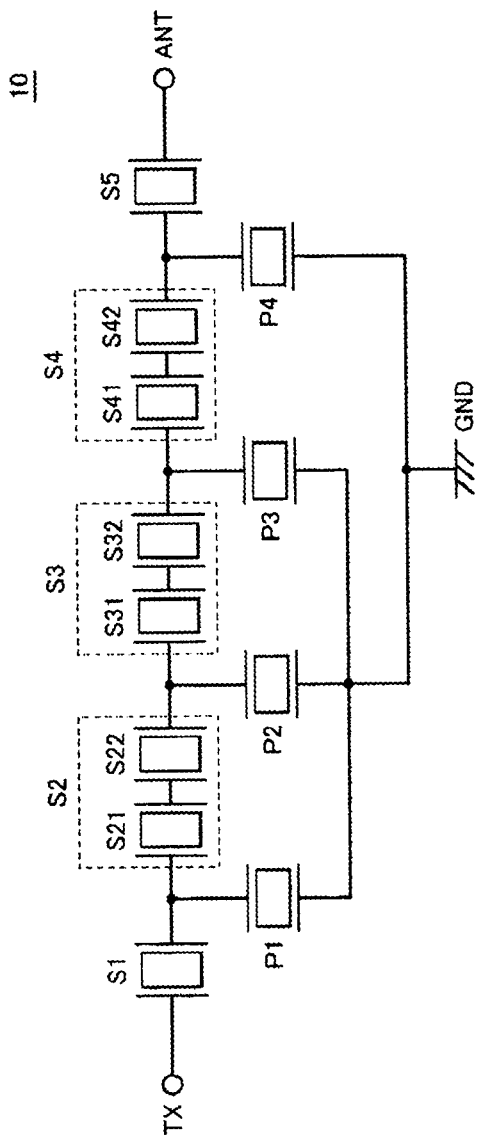
FIG. 1 is a circuit configuration of a filter device including acoustic wave devices according to a first preferred embodiment of the present invention.

Hereinafter, preferred embodiments of the present disclosure will be described in detail with reference to the drawings. Like reference signs denote the same or corresponding portions in the drawings, and the description thereof will not be repeated.

First Preferred Embodiment

Configuration of Filter Device

FIG. 1 is a diagram showing the circuit configuration of a filter device 10 including acoustic wave devices according to a first preferred embodiment. The filter device 10 is a filter device preferably for use in a transmission circuit of a communication device and is a ladder filter connected between a transmission terminal TX and an antenna terminal ANT, for example. The filter device 10 filters a signal received at the transmission terminal TX and outputs the signal from the antenna terminal ANT.

The filter device 10 includes series arm resonant portions S1 to S5 connected in series between the transmission terminal TX and the antenna terminal ANT, and parallel arm resonant portions P1 to P4. Each of the series arm resonant portions S1 to S5 and the parallel arm resonant portions P1 to P4 includes at least one acoustic wave resonator. In the example of FIG. 1, each of the series arm resonant portions S1, S5 and the parallel arm resonant portions P1 to P4 includes a single acoustic wave resonator, and each of the series arm resonant portions S2 to S4 includes two acoustic wave resonators. The series arm resonant portion S2 includes acoustic wave resonators S21, S22 connected in series. The series arm resonant portion S3 includes acoustic wave resonators S31, S32 connected in series. The series arm resonant portion S4 includes acoustic wave resonators S41, S42 connected in series. The number of acoustic wave resonators included in each resonant portion is not limited thereto and may be selected as needed so as to be adapted to the characteristics of the filter device. A surface acoustic wave (SAW) resonator may be used as the acoustic wave resonator.

One end of the parallel arm resonant portion P1 is connected to a junction point between the series arm resonant portion S1 and the series arm resonant portion S2, and the other end is connected to a ground potential. One end of the parallel arm resonant portion P2 is connected to a junction point between the series arm resonant portion S2 and the series arm resonant portion S3, and the other end is connected to the ground potential. One end of the parallel arm resonant portion P3 is connected to a junction point between the series arm resonant portion S3 and the series arm resonant portion S4, and the other end is connected to the ground potential. One end of the parallel arm resonant portion P4 is connected to a junction point between the series arm resonant portion S4 and the series arm resonant portion S5, and the other end is connected to the ground potential.

Configuration of Acoustic Wave Device

Figure 2:
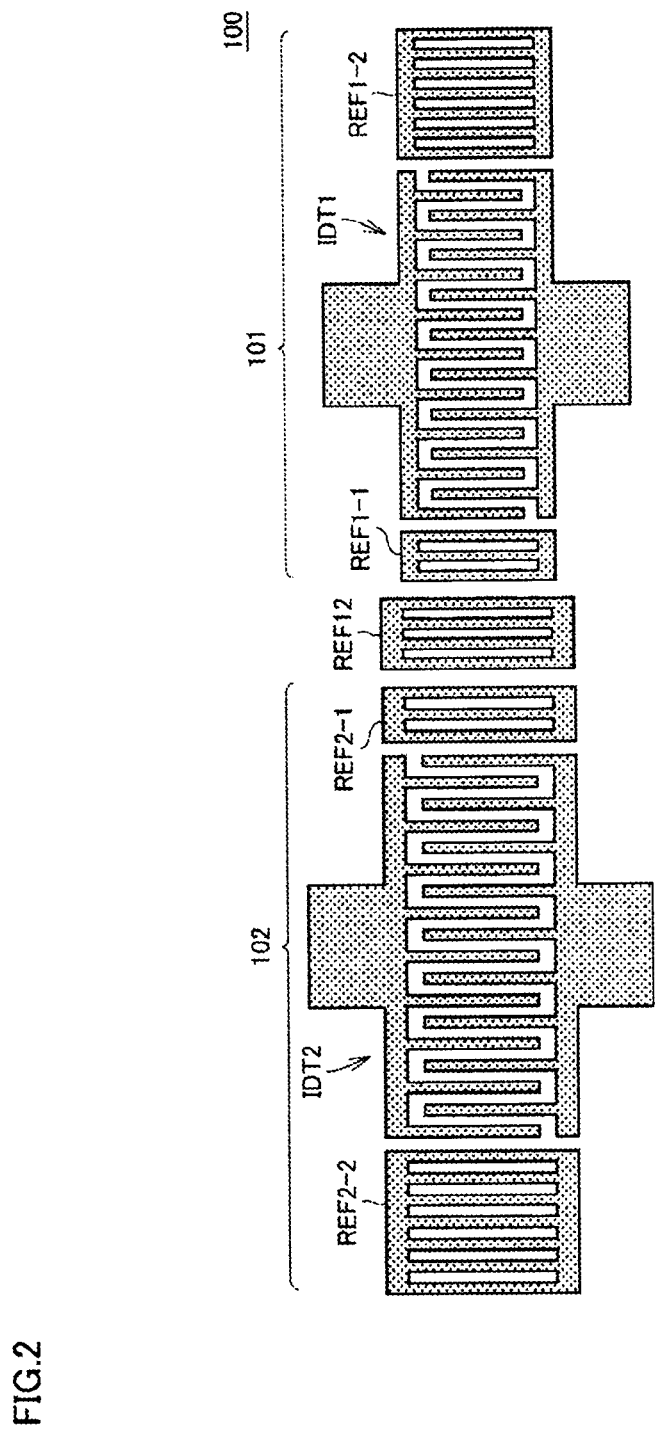
FIG. 2 is a top view for illustrating the basic configuration of the acoustic wave device according to the first preferred embodiment of the present invention.
Figure 3:
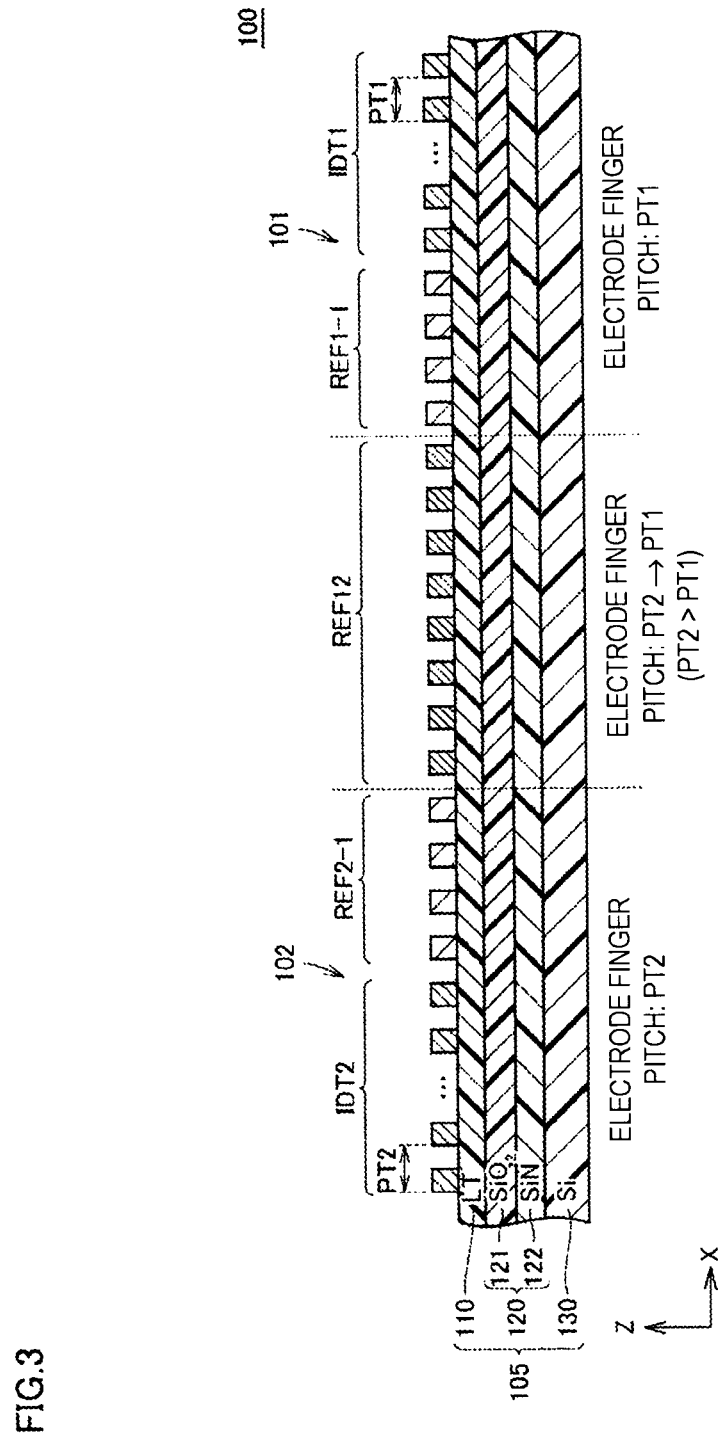
FIG. 3 is a cross-sectional view of the acoustic wave device according to the first preferred embodiment of the present invention.

Next, the basic configuration of an acoustic wave device 100 according to the first preferred embodiment will be described with reference to FIG. 2 and FIG. 3. FIG. 2 is a top view of a portion where a shared reflector is between adjacent resonators in the acoustic wave device 100. FIG. 3 is a cross-sectional view of the portion between the adjacent resonators.

As shown in FIG. 2 and FIG. 3, the acoustic wave device 100 includes adjacent two acoustic wave resonator 101, 102, and a shared reflector REF12. Each of the acoustic wave resonators 101, 102 included in the acoustic wave device 100 corresponds to the resonator included in any one of the series arm resonant portions S1 to S5 and the parallel arm resonant portions P1 to P4 in the filter device 10 illustrated in FIG. 1.

Each of the acoustic wave resonators 101, 102 is a SAW resonator including an interdigital transducer electrode. Specifically, the acoustic wave resonator 101 includes an interdigital transducer electrode IDT1, and reflectors REF1-1, REF1-2 disposed on both sides of the interdigital transducer electrode IDT1. The acoustic wave resonator 102 includes an interdigital transducer electrode IDT2, and reflectors REF2-1, REF2-2 disposed on both sides of the interdigital transducer electrode IDT2.

In the interdigital transducer electrode, surface acoustic waves propagate in a direction orthogonal to a direction in which the facing electrode fingers extend. The reflectors are used to trap surface acoustic waves having leaked from the end portions of the interdigital transducer electrode in the interdigital transducer electrode by reflecting the surface acoustic waves. Thus, the quality factor of the acoustic wave resonator is enhanced.

As shown in FIG. 3, the interdigital transducer electrode and the reflectors that are included in each of the acoustic wave resonators are provided on the substrate 105 having the piezoelectric layer 110. The substrate 105 includes a low acoustic velocity layer 121, a high acoustic velocity layer 122, and a support layer 130 in addition to the piezoelectric layer 110.

The support layer 130 is a semiconductor substrate made of, for example, silicon (Si). The high acoustic velocity layer 122, the low acoustic velocity layer 121, and the piezoelectric layer 110 are laminated on the support layer 130 in order in the positive direction of the Z-axis in FIG. 3.

The piezoelectric layer 110 is made of, for example, a piezoelectric monocrystal material, such as lithium tantalate ($LiTaO_3$) and lithium niobate ($LiNbO_3$), or a multilayer piezoelectric material made of aluminum nitride (AlN), $LiTaO_3$, or $LiNbO_3$. The interdigital transducer electrode and the reflectors that are functional elements are provided on the top surface (the surface in the positive direction of the Z-axis) of the piezoelectric layer 110. In the example of FIG. 3, lithium tantalate (LT) is used as the piezoelectric layer 110.

The interdigital transducer electrode and the reflectors are made of, for example, a material, such as elemental metal including at least one of aluminum, copper, silver, gold, titanium, tungsten, platinum, chromium, nickel, and molybdenum, and alloys containing the elemental metal as a main ingredient.

The low acoustic velocity layer 121 is made of a material such that bulk waves propagate through the low acoustic velocity layer 121 at an acoustic velocity lower than bulk waves propagate through the piezoelectric layer 110. In the example of FIG. 3, the low acoustic velocity layer 121 is made of silicon dioxide ($SiO_2$). However, the low acoustic velocity layer 121 is not limited to silicon dioxide and may be made of, for example, another dielectric, such as glass, silicon oxynitride, and tantalum oxide, a chemical compound obtained by adding fluorine, carbon, boron, or the like to silicon dioxide, or the like.

The high acoustic velocity layer 122 is made of a material such that bulk waves propagate through the high acoustic velocity layer 122 at an acoustic velocity higher than acoustic waves propagate through the piezoelectric layer 110. In the example of FIG. 3, the high acoustic velocity layer 122 is made of silicon nitride (SiN). However, the high acoustic velocity layer 122 is not limited to silicon nitride and may be made of a material, such as aluminum nitride, aluminum oxide (alumina), silicon oxynitride, silicon carbide, diamondlike carbon (DLC), and diamond.

With the configuration that the low acoustic velocity layer 121 and the high acoustic velocity layer 122 are laminated on the lower side of the piezoelectric layer 110, the low acoustic velocity layer 121 and the high acoustic velocity layer 122 define and function as a reflection layer (mirror layer) 120. In other words, surface acoustic waves having leaked in a direction from the piezoelectric layer 110 toward the support layer 130 are reflected by the high acoustic velocity layer 122 due to a difference in propagating acoustic velocity and are trapped in the low acoustic velocity layer 121. In this way, the loss of acoustic energy of surface acoustic waves to be propagated is reduced by the reflection layer 120, so it is possible to efficiently propagate surface acoustic waves. In FIG. 3, the example in which the low acoustic velocity layer 121 and the high acoustic velocity layer 122 each are including a single layer as the reflection layer 120 has been described. Alternatively, the reflection layer 120 may be configured such that a plurality of the low acoustic velocity layers 121 and a plurality of the high acoustic velocity layers 122 are alternately disposed.

Referring back to FIG. 2, the reflector REF1-1 of the acoustic wave resonator 101 is disposed at the acoustic wave resonator 102 side in the interdigital transducer electrode IDT1. The reflector REF1-2 is on one side of the interdigital transducer electrode IDT1 and the reflector REF1-1 is on the other side of the reflector. The electrode fingers of each of the reflectors REF1-1, REF1-2 are positioned with the same pitch as the electrode fingers of the interdigital transducer electrode IDT1.

The reflector REF2-1 of the acoustic wave resonator 102 is disposed at the acoustic wave resonator 101-side in the interdigital transducer electrode IDT2. The reflector REF2-2 is disposed across the interdigital transducer electrode IDT2 from the reflector REF2-1. The electrode fingers of each of the reflectors REF2-1, REF2-2 are positioned with the same pitch as the electrode fingers of the interdigital transducer electrode IDT2.

The shared reflector REF12 is disposed between the reflector REF1-1 of the acoustic wave resonator 101 and the reflector REF2-1 of the acoustic wave resonator 102. The sum of the number of the electrode fingers of the reflector REF1-1 and the number of the electrode fingers of the shared reflector REF12 is set to the same number as the number of the electrode fingers of the reflector REF1-2. The sum of the number of the electrode fingers of the reflector REF2-1 and the number of the electrode fingers of the shared reflector REF12 is set to the same number as the number of the electrode fingers of the reflector REF2-2. The length of each of the electrode fingers of the shared reflector REF12 is longer than or equal to the overlap width of electrode fingers in the interdigital transducer electrode included in each of the acoustic wave resonator 101 and the acoustic wave resonator 102.

The frequency characteristics of the shared reflector REF12 are intermediate frequency characteristics between the frequency characteristics of the acoustic wave resonator 101 and the frequency characteristics of the acoustic wave resonator 102. With this configuration, the shared reflector REF12 defines and functions as a reflector for both the acoustic wave resonator 101 and the acoustic wave resonator 102.

In the first preferred embodiment, the intermediate frequency characteristics are implemented by positioning at least a portion of the electrode fingers of the shared reflector REF12 with a pitch between the pitch (first pitch: PT1) of the electrode fingers of each of the interdigital transducer electrode IDT1 and the reflectors REF1-1, REF1-2 in the acoustic wave resonator 101 and the pitch (second pitch: PT2) of the electrode fingers of each of the interdigital transducer electrode IDT2 and the reflectors REF2-1, REF2-2 in the acoustic wave resonator 102. Here, the pitch of electrode fingers is a center-to-center distance between adjacent electrode fingers.

Frequency characteristics are able to be measured by bringing a contact pin connected to a network analyzer into contact in a state where wires connected to the resonators and the reflectors are not included as much as possible.

In the shared reflector REF12, the overall electrode fingers may be positioned with an intermediate pitch, or the pitch may be gradually changed from the acoustic wave resonator 101 toward the acoustic wave resonator 102. Alternatively, the pitch may be changed in a stepwise manner from the acoustic wave resonator 101 toward the acoustic wave resonator 102.

The reflector REF1-1 in the acoustic wave resonator 101 and the reflector REF2-1 in the acoustic wave resonator 102 are not necessarily indispensable. Alternatively, only the shared reflector REF12 may be disposed between the interdigital transducer electrode IDT1 of the acoustic wave resonator 101 and the interdigital transducer electrode IDT2 of the acoustic wave resonator 102. In this case, the number of the electrode fingers of the shared reflector REF12 is preferably the same as the number of electrode fingers of each of the reflector REF1-2 and the reflector REF2-2.

FIG. 4 is a top view of adjacent resonators in an acoustic wave device 100 # of a comparative example. The acoustic wave device 100 # includes adjacent two acoustic wave resonators 101 #, 102 #. In the acoustic wave device 100 #, reflectors (REF1-2, REF2-2) in the same shape are disposed on both sides of the interdigital transducer electrode of each acoustic wave resonator. In other words, the number of the electrode fingers of each of the reflectors disposed on both sides the same in each of the acoustic wave resonators. Therefore, when, for example, the number of the electrode fingers of each of the reflectors REF1-2, REF2-2 is 20, the total number of the electrode fingers of the reflectors disposed between the two interdigital transducer electrodes is 40.

On the other hand, in the acoustic wave device 100 of the first preferred embodiment, when, for example, the number of the electrode fingers of each of the reflectors REF1-1, REF2-1 is eight and the number of the electrode fingers of the shared reflector REF12 is 12, the total number of the electrode fingers of the reflector REF1-1 and the shared reflector REF12 and the total number of the electrode fingers of the reflector REF2-1 and the shared reflector REF12 each are 20 and are equal to the number of the electrode fingers of each of the reflectors REF1-2, REF2-2. However, the total number of the electrode fingers of the reflector disposed between the two interdigital transducer electrodes is reduced to 28. Therefore, it is possible to narrow the space between the two interdigital transducer electrodes while suppressing a decrease in reflectance by maintaining the number of the electrode fingers that define and function as a reflector for each of the acoustic wave resonators. Thus, in comparison with the acoustic wave device 100 # of the comparative example, the size of the acoustic wave device 100 is reduced.

Figure 5A:
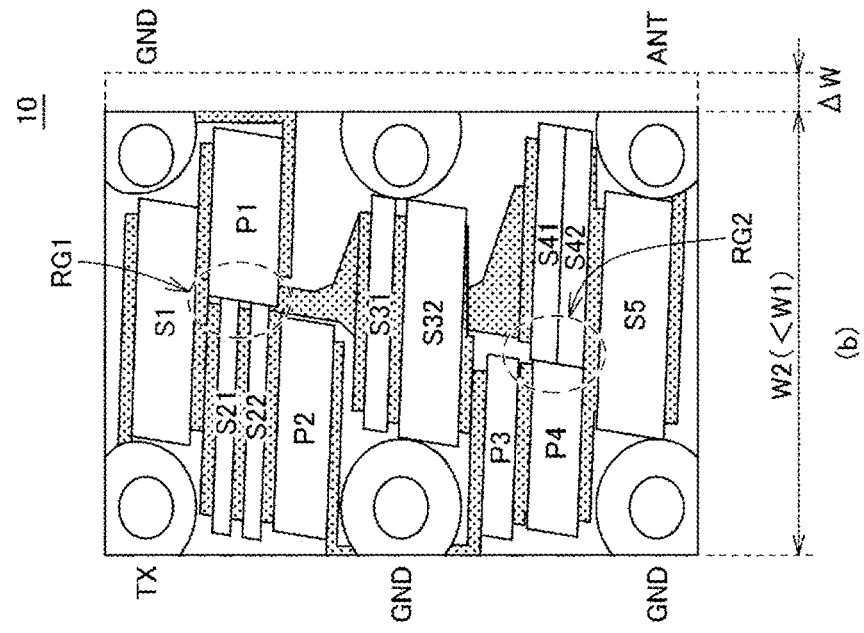
FIGS. 5A and 5B show plan views of the filter device including the acoustic wave device of the first preferred embodiment of the present invention and a plan view of a filter device including the acoustic wave device of the comparative example.
Figure 5B:
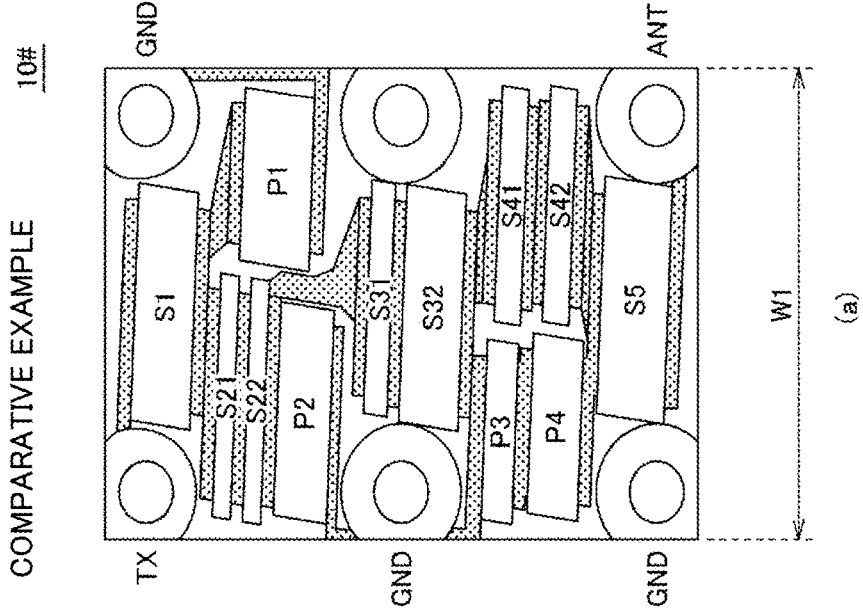

FIGS. 5A and 5B show plan views of a filter device including the acoustic wave device of the comparative example and a plan view of the filter device including the acoustic wave device of the first preferred embodiment. FIG. 5A shows the case where the components of the acoustic wave device of the comparative example are included. FIG. 5B shows the case where the components of the acoustic wave device of the first preferred embodiment are included. In FIGS. 5A and 5B, arrangement of the contacts (TX, ANT, GND), the resonant portions (S1 to S5, P1 to P4), and a wiring portion 15 that connects these resonant portions is shown. Of these, the components of the first preferred embodiment are applied to a portion (the region RG1 in FIG. 5B) between the series arm resonant portion S2 (acoustic wave resonators S21, S22) and the parallel arm resonant portion P1 and a portion (the region RG2 in FIG. 5B) between the series arm resonant portion S4 (acoustic wave resonators S41, S42) and the parallel arm resonant portion P4.

As shown in FIG. 5A, the width W1 of the filter device 10 # is limited by the length of portions where the acoustic wave resonators are disposed adjacent to each other. Therefore, as in the case of the filter device 10 of FIG. 5B, when acoustic wave resonators are disposed adjacent to each other by using a shared reflector in portions in the regions RG1, RG2, the width W2 of the filter device 10 is able to be narrower than that in the case of the comparative example (W2<W1).

Figure 6:
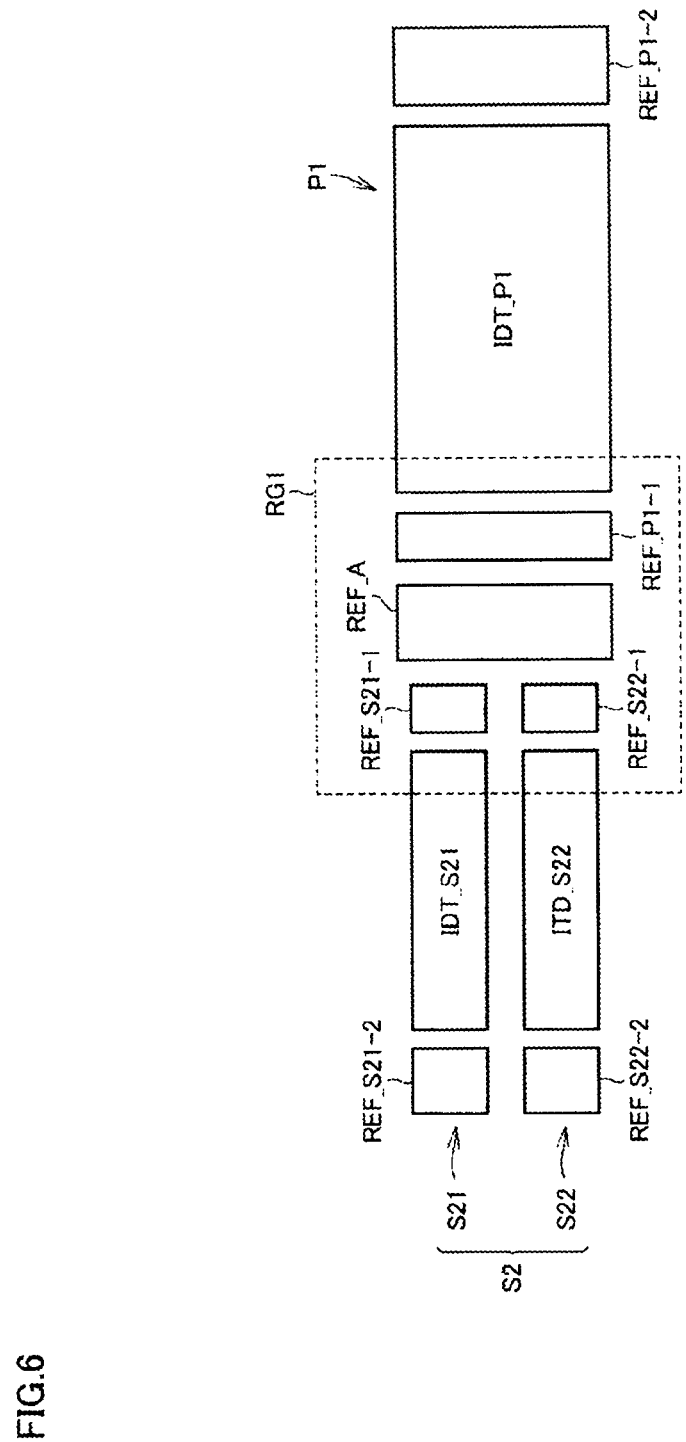
FIG. 6 is a view for illustrating the detailed configuration of a portion in a region RG1 of FIG. 5B.
Figure 7:
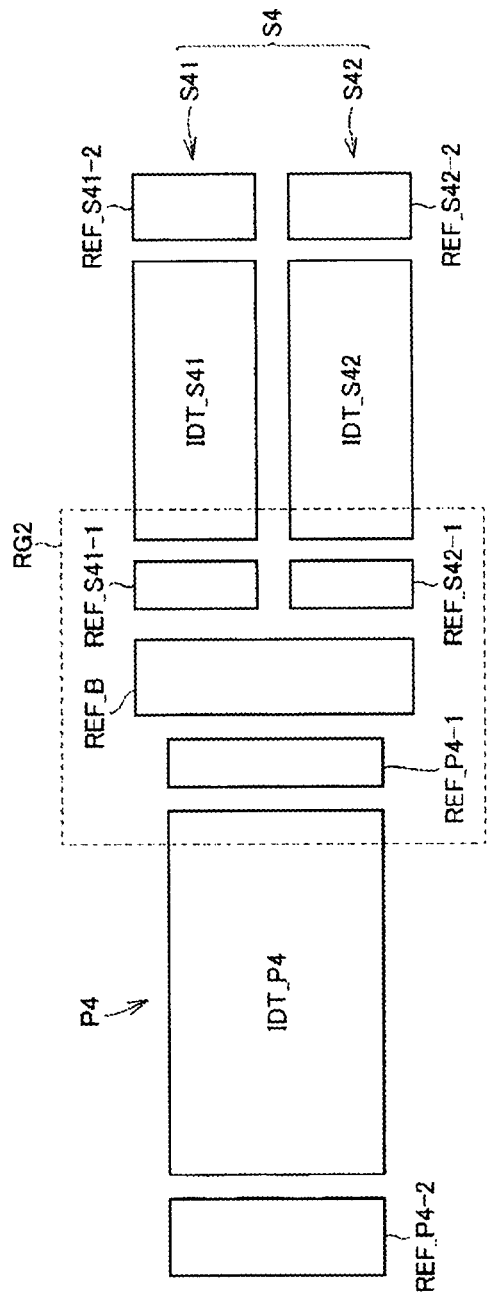
FIG. 7 is a view for illustrating the detailed configuration of a portion in a region RG2 of FIG. 5B.

FIG. 6 and FIG. 7 are respectively views for illustrating the detailed configurations of the portions in the regions RG1, RG2 of FIG. 5B. In any of FIG. 6 and FIG. 7, a reflector is shared between the parallel arm resonant portion including a single acoustic wave resonator and the series arm resonant portion including two acoustic wave resonators.

As shown in FIG. 6, the acoustic wave resonator S21 includes an interdigital transducer electrode IDT_S21 and reflectors REF_S21-1, REF_S21-2, and the acoustic wave resonator S22 includes an interdigital transducer electrode IDT_S22 and reflectors REF_S22-1, REF_S22-2. The acoustic wave resonator of the parallel arm resonant portion P1 includes an interdigital transducer electrode IDT_P1 and reflectors REF_P1-1, REF_P1-2. In each of these three acoustic wave resonators, a shared reflector REF_A is disposed so as to face the reflectors REF_S21-1, REF_S22-1, REF_P1-1.

The reflectors REF_S21-1, REF_S22-1 are disposed adjacent to each other on a first end portion side of the shared reflector REF_A, and the reflector REF_P1-1 is disposed adjacent to a second end portion side of the shared reflector REF_A. The length of the electrode fingers of the shared reflector REF_A is set so as to be longer than the length of the electrode fingers of the reflector REF_P1-1 and longer than the sum of the length of the electrode fingers of the reflector REF_S21-1 and the length of the electrode fingers of the reflector REF_S22-1.

With such a configuration, in comparison with the case where reflectors are individually disposed for each acoustic wave resonator, the length from the end portion of each of the reflectors REF S21-2, REF_S22-2 to the end portion of the reflector REF_P1-2 is reduced.

As shown in FIG. 7, the acoustic wave resonator S41 includes an interdigital transducer electrode IDT_S41 and reflectors REF_S41-1, REF_S41-2, and the acoustic wave resonator S42 includes an interdigital transducer electrode IDT_S42 and reflectors REF_S42-1, REF_S42-2. The acoustic wave resonator of the parallel arm resonant portion P4 includes an interdigital transducer electrode IDT_P4 and reflectors REF_P4-1 and REF_P4-2. In each of these three acoustic wave resonators, a shared reflector REF_B is disposed so as to face the reflectors REF_S41-1, REF_S42-1, REF_P4-1.

The reflectors REF_S41-1, REF_S42-1 are disposed adjacent to each other on a first end portion side of the shared reflector REF_B, and the reflector REF_P4-1 is disposed adjacent to a second end portion side of the shared reflector REF_B. The length of the electrode fingers of the shared reflector REF_B is set so as to be longer than the length of the electrode fingers of the reflector REF_P4-1 and longer than the sum of the length of the electrode fingers of the reflector REF_S41-1 and the length of the electrode fingers of the reflector REF_S42-1.

With such a configuration, in comparison with the case where reflectors are individually disposed for each acoustic wave resonator, the length from the end portion of each of the reflectors REF_S41-2, REF_S42-2 to the end portion of the reflector REF_P4-2 is reduced.

Figure 9A:
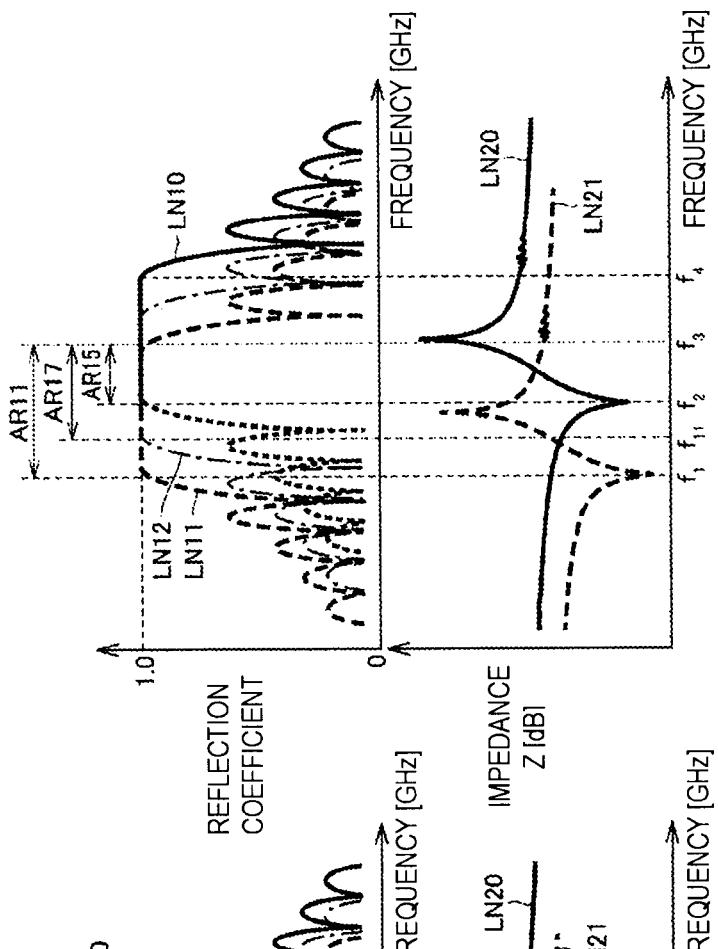
FIGS. 9A and 9B show graphs for illustrating the frequency characteristics of the acoustic wave device of the first preferred embodiment of the present invention.
Figure 9B:
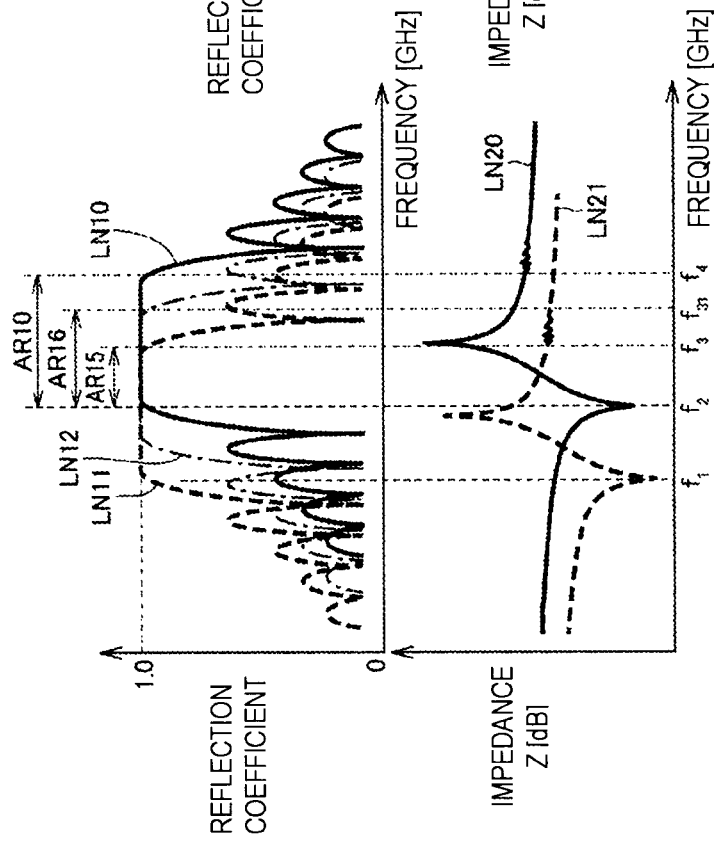

Reflection characteristics in the case where a shared reflector is used in adjacent acoustic wave resonators will be described with reference to FIG. 8 and FIGS. 9A and 9B. In each of FIG. 8, FIG. 9A, and 9B, the frequency characteristics of the reflection coefficient of each reflector are shown at the top, and the frequency characteristics of the impedance of each of the resonators is shown at the bottom. In FIG. 8 and FIGS. 9A and 9B, the continuous line LN10 and the continuous line LN20 correspond to series arm resonators, and the dashed line LN11 and the dashed line LN21 correspond to parallel arm resonators.

As shown in FIG. 8, a ladder filter as shown in FIG. 1 is generally designed such that the resonant frequency of each series arm resonator and the anti-resonant frequency of each parallel arm resonator substantially coincide with each other. In other words, a stop band in which the reflection coefficient is asymptotic to one in the reflectors of the series arm resonator is between frequency f2 and frequency f4 (the range AR10). On the other hand, a stop band in which the reflection coefficient is asymptotic to one in the reflectors of the parallel arm resonator is between frequency f1 and frequency f3 (the range AR11).

Therefore, when the reflector is shared between the series arm resonator and the parallel arm resonator and the pitch of the electrode fingers of the reflector is set to the electrode finger pitch of the interdigital transducer electrode of any one of the resonators, the reflectance is ensured in the range between frequency f2 and frequency f4 (range AR15) but the reflectance can significantly decrease in the range between frequency f1 and frequency f2 or in the range between frequency f3 and frequency f4. As a result, in the range in which the reflectance decreases, surface acoustic waves from one of the resonators are not reflected and leak to the other one of the resonators, so the deterioration of filter characteristics can occur.

On the other hand, as in the case of the first preferred embodiment of the present application, when at least a portion of the electrode finger pitch of the shared reflector is set to an intermediate pitch between the electrode finger pitches of the two resonators, the reflection coefficient of the shared reflector is, for example, as indicated by the alternate long and short dashed line LN12 in FIGS. 9A and 9B. As a result, as shown in FIG. 9A, a stop band for the series arm resonator is expanded to the range between frequency f2 and frequency f31 (range AR16). Similarly, a stop band for the parallel arm resonator is expanded to the range between frequency f11 and frequency f3 (range AR17) as shown in FIG. 9B. In other words, a lower limit frequency of the stop band of the shared reflector is between a lower limit frequency of the stop band of the first resonator and a lower limit frequency of the stop band of the second resonator, and an upper limit frequency of the stop band of the shared reflector is between an upper limit frequency of the stop band of the first resonator and an upper limit frequency of the stop band of the second resonator. Therefore, in comparison with the case where the electrode finger pitch of the shared reflector is made equal to the electrode finger pitch of any one of the resonators, a stop band in the filter device is expanded, with the result that the deterioration of the filter characteristics is suppressed.

The "stop band" in the first preferred embodiment represents a frequency range having a reflection coefficient higher than about 70% of the peak value of the reflection coefficient, for example. In the first preferred embodiment, the lower limit frequency of the stop band corresponds to the resonant frequency of each resonator. The upper limit frequency of the stop band corresponds to the frequency at which a stop band ripple begins to appear (regions RG10, RG11 in FIG. 8) in the impedance characteristics of each resonator.

In each resonator, the strength of excited surface acoustic waves is maximum in the center region of the interdigital transducer electrode and monotonously reduces with distance from the center region increases in the regions of the reflectors at both ends. For this reason, as the distance from the interdigital transducer electrode in the shared reflector increases, the influence of a decrease in reflectance reduces even when the electrode finger pitch is different from the electrode finger pitch of the interdigital transducer electrode. Therefore, by setting the electrode finger pitch of the shared reflector so as to change gradually or in a stepwise manner from the electrode finger pitch of one of the resonators toward the electrode finger pitch of the other one of the resonators, the reflectance between the frequencies f1 and f11 and the reflectance between the frequencies f31 and f4 in FIGS. 9A and 9B are able to be ensured, so the influence of a decrease in reflectance is further reduced.

When a series arm resonator and a parallel arm resonator are adjacent to each other by using a shared reflector as shown in FIGS. 9A and 9B, the higher frequency-side range and the lower frequency-side range of a stop band are narrowed in no small part. For this reason, to maintain the steepness of attenuation characteristics at pass band end portions as an overall filter in a ladder filter, a shared reflector is preferably not used for a resonator that forms a highest frequency-side attenuation pole and a resonator that forms a lowest frequency-side attenuation pole.

Generally, in a ladder filter, a higher frequency-side attenuation pole is formed by a series arm resonator, and a lower frequency-side attenuation pole is formed by a parallel arm resonator. For this reason, a series arm resonant portion that includes a plurality of series arm resonators preferably includes a series arm resonator (third resonator) much narrower in electrode finger pitch than a series arm resonator (first resonator) that uses a shared reflector.

In addition, a parallel arm resonant portion that includes a plurality of parallel arm resonators preferably includes a parallel arm resonator (fourth resonator) much wider in electrode finger pitch than a parallel arm resonator (second resonator) that uses a shared reflector.

As described above, when a shared reflector is disposed between adjacent two acoustic wave resonators (the first resonator and the second resonator) and at least a portion of the electrode finger pitch of the shared reflector is set to a pitch between the electrode finger pitch of the interdigital transducer electrode of the first resonator and the electrode finger pitch of the interdigital transducer electrode of the second resonator to obtain intermediate frequency characteristics, a reduction in the size of an acoustic wave device is achieved while a decrease in the frequency characteristics of the acoustic wave device is suppressed.

FIG. 10 is a table showing an example of the specifications of the acoustic wave device 100 according to the first preferred embodiment. In the example, the number of pairs of the electrode fingers of the interdigital transducer electrode of resonator 1 is 130, and the number of the electrode fingers is 261. The wave length (=(Electrode Finger Pitch)× 2) is 1.5495 µm, and the resonant frequency is 2453.39 MHz. On the other hand, the number of pairs of the electrode fingers of the interdigital transducer electrode of resonator 2 is 90, and the number of the electrode fingers is 181. The wave length is 1.60700 µm, and the resonant frequency is 2358.11 MHz. The number of the electrode fingers of the interdigital transducer of the shared reflector is eight, and the number of the electrode fingers of the interdigital transducer of the reflector disposed between the shared reflector and each interdigital transducer electrode is 10. In any of the resonators, the duty is 0.5. The film thickness of the electrode fingers of resonator 1 and the film thickness of the electrode fingers of resonator 2 are the same.

In the example, the wave length of the shared reflector gradually increases from 1.5495 µm to 1.90700 µm from resonator 1 toward resonator 2. In this way, by setting the wave length (electrode finger pitch) of the shared reflector to an intermediate pitch between the two wave lengths (electrode finger pitches) of the two resonators, a reduction in the size of an acoustic wave device is achieved while a decrease in the frequency characteristics of the acoustic wave device is suppressed. Since the film thickness and duty of the electrode fingers are the same between resonator 1 and resonator 2, the frequency of resonator 2 with a greater electrode finger pitch is lower than the frequency of resonator 1.

First Modification

In the acoustic wave device 100 of the first preferred embodiment shown in FIG. 2, the configuration in which two acoustic wave resonators disposed adjacent to each other are disposed such that the centers of the propagation directions of surface acoustic waves coincide with each other, that is, the directions passing through the center of the overlap width of the interdigital transducer electrode and orthogonal to the electrode fingers coincide with each other has been described. However, the centers of the propagation directions of surface acoustic waves in two acoustic wave resonators may be different from each other.

Figure 11:
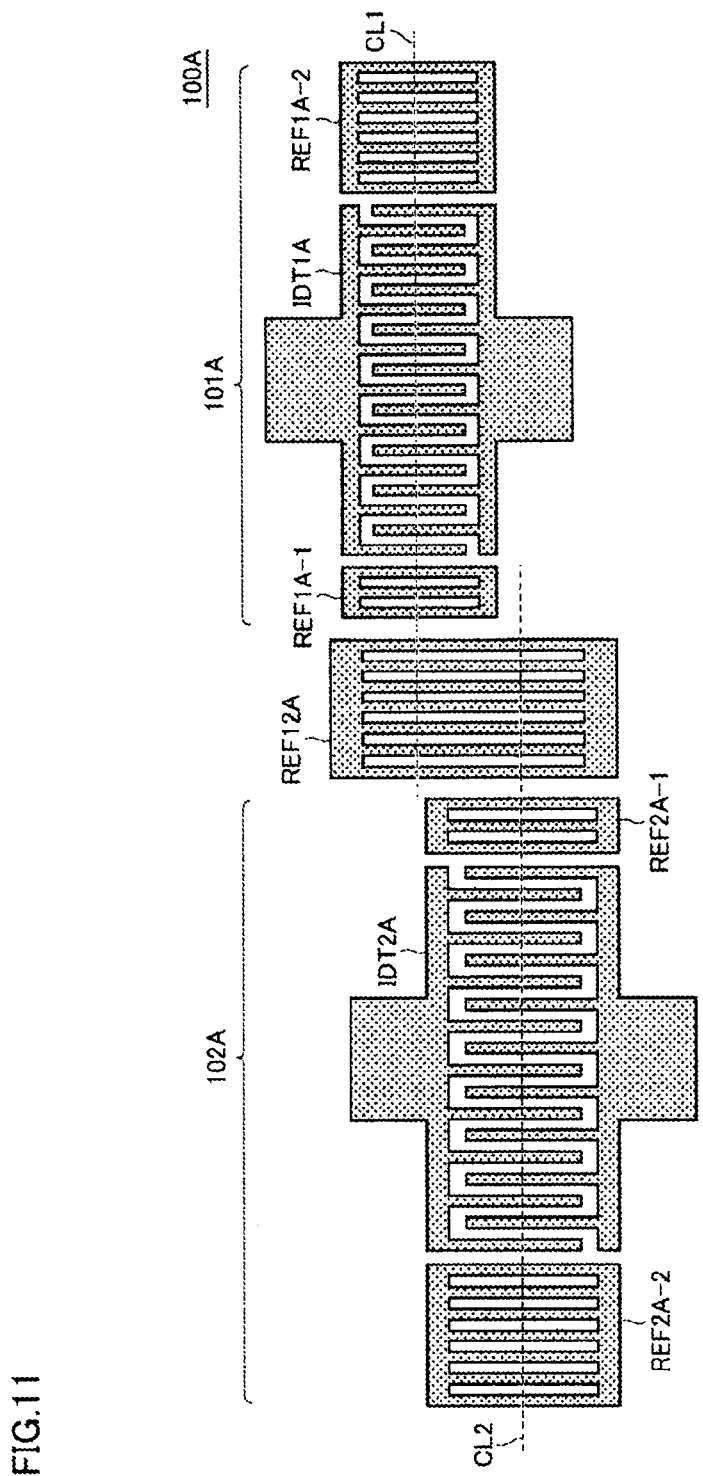
FIG. 11 is a top view of an acoustic wave device according to a first modification of a preferred embodiment of the present invention.

FIG. 11 is a top view of an acoustic wave device 100A according to a first modification. The acoustic wave device 100A includes acoustic wave resonators 101A, 102A having a similar configuration to those of FIG. 2, and a shared reflector REF12A disposed between the acoustic wave resonators 101A, 102A. The acoustic wave resonator 101A includes an interdigital transducer electrode IDT1A, and reflectors REF1A-1, REF1A-2. The acoustic wave resonator 102A includes an interdigital transducer electrode IDT2A, and reflectors REF2A-1, REF2A-2.

In the acoustic wave device 100A, the centers of the propagation directions of surface acoustic waves in the two acoustic wave resonators 101A, 102A are offset and do not overlap each other. Specifically, an imaginary line CL1 passing through the center of the overlap width of the electrode fingers of the acoustic wave resonator 101A and orthogonal to the electrode fingers and an imaginary line CL2 passing through the center of the overlap width of the electrode fingers of the acoustic wave resonator 102A and orthogonal to the electrode fingers are offset in a direction in which the electrode fingers extend.

The electrode fingers of the shared reflector REF12A have a length so as to face both the electrode fingers of the reflector REF1A-1 in the acoustic wave resonator 101A and the electrode fingers of the reflector REF2A-1 in the acoustic wave resonator 102A.

The configuration is also applied to the regions RG1, RG2 of the filter device 10 described above with reference to FIG. 6 and FIG. 7.

In this way, even when the propagation directions of surface acoustic waves in adjacent acoustic wave resonators do not overlap each other, but when a shared reflector with electrode fingers having a length so as to face the electrode fingers of the resonators, the flexibility of arrangement of functional elements on the substrate is increased while the size of the acoustic wave device is reduced. Even if surface acoustic waves leak from the shared reflector, the leaked surface acoustic waves enter a region off from the center of the overlap width of the interdigital transducer electrode in the other one of the acoustic wave resonators. Therefore, in comparison with the case where there is no offset in the propagation direction of surface acoustic waves and the propagation directions overlap, the influence on the other one of the acoustic wave resonators is reduced.

Second Modification

In the acoustic wave devices of the first preferred embodiment and the first modification, the configuration in which the electrode fingers in each of the interdigital transducer electrode and the reflectors extend in the direction orthogonal to the busbars connected to the electrode fingers has been described. In an acoustic wave device of a second modification, the configuration in which the electrode fingers of each of an interdigital transducer electrode and reflectors are disposed obliquely with respect to busbars will be described.

Figure 12:
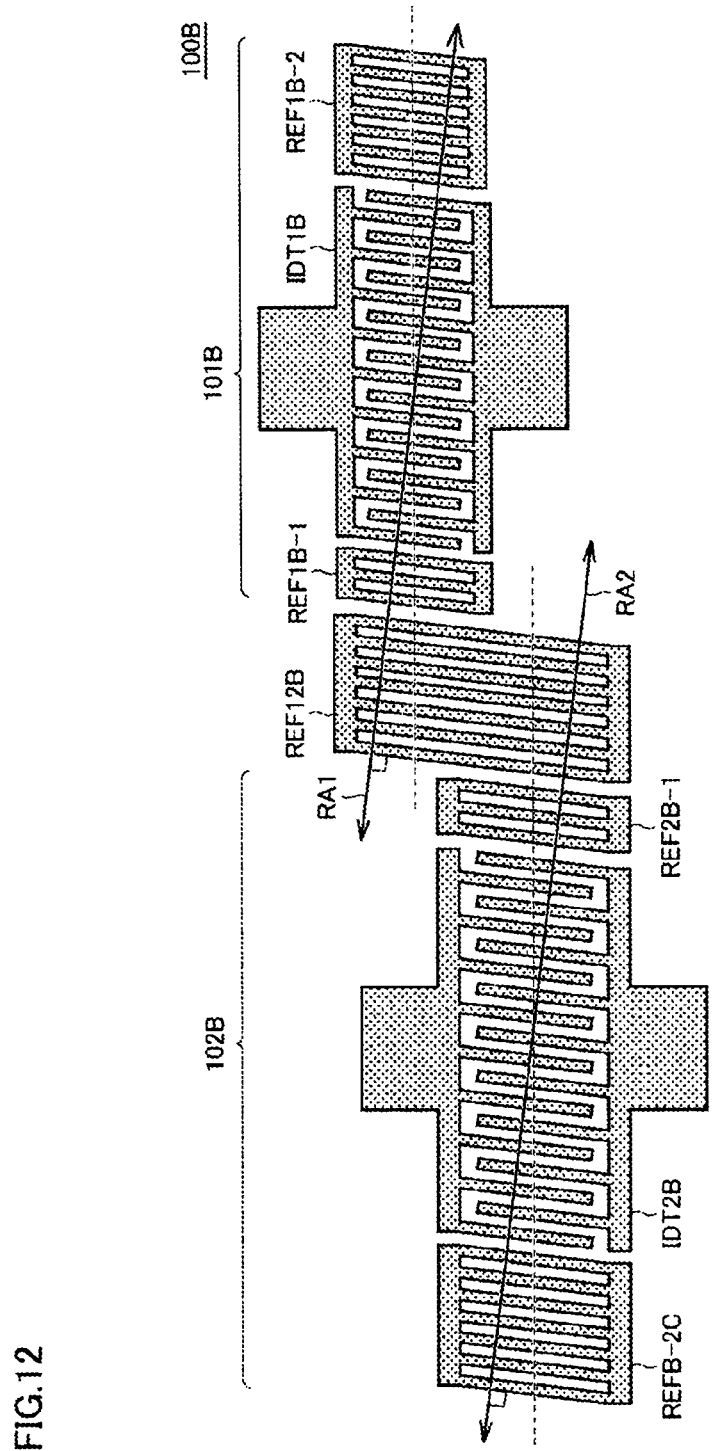
FIG. 12 is a top view of an acoustic wave device according to a second modification of a preferred embodiment of the present invention.

FIG. 12 is a top view of an acoustic wave device 100B according to the second modification. The acoustic wave device 100B includes acoustic wave resonators 101B, 102B, and a shared reflector REF12B disposed between the acoustic wave resonators 101B, 102B. As in the case of the first modification, the acoustic wave resonator 101B and the acoustic wave resonator 102B are disposed at offset positions.

The acoustic wave resonator 101B includes an interdigital transducer electrode IDT1B, and reflectors REF1B-1, REF1B-2 disposed on both sides of the interdigital transducer electrode IDT1B. The acoustic wave resonator 102B includes an interdigital transducer electrode IDT2B, and reflectors REF2B-1, REF2B-2 disposed on both sides of the interdigital transducer electrode IDT2B.

The shared reflector REF12B is disposed between the reflector REF1B-1 and the reflector REF2B-1. The sum of the number of the electrode fingers of the reflector REF1B-1 and the number of the electrode fingers of the shared reflector REF12B is the same as the number of the electrode fingers of the reflector REF1B-2. The sum of the number of the electrode fingers of the reflector REF2B-1 and the number of the electrode fingers of the shared reflector REF12B is the same as the number of the electrode fingers of the reflector REF2B-2. In the acoustic wave device 100B, the electrode fingers of each of the acoustic wave resonators 101B, 102B and the shared reflector REF12B are connected obliquely to the busbars. An angle between each electrode finger and the busbar is larger than 0° and smaller than 90°.

In the acoustic wave resonator, generally, surface acoustic waves propagate in a direction orthogonal to the electrode fingers. In other words, as shown in FIG. 12, surface acoustic waves propagate in the direction of the arrow RA1 in the acoustic wave resonator 101B, and surface acoustic waves propagate in the direction of the arrow RA2 in the acoustic wave resonator 102B. In this way, by disposing the adjacent acoustic wave resonators so as to be offset from each other and further disposing the electrode fingers so as to incline with respect to the busbars, the propagation direction of surface acoustic waves in one of the acoustic wave resonators is able to be outside the overlap width region of the electrode fingers in the interdigital transducer electrode of the other one of the acoustic wave resonators. Therefore, the influence of surface acoustic waves having leaked from the shared reflector on the other one of the acoustic wave resonators is further reduced.

Second Preferred Embodiment

In the first preferred embodiment, the configuration in which, in the case of the configuration in which the electrode finger pitches of the adjacent acoustic wave resonators are different from each other, the frequency characteristics of the shared reflector are adjusted by setting the pitch of the electrode fingers of the shared reflector to an intermediate pitch has been described.

In a second preferred embodiment, the configuration in which, in the case of the configuration in which the duty of the electrode fingers of adjacent acoustic wave resonators are different from each other, the frequency characteristics of a shared reflector are adjusted by setting the duty of the electrode fingers of the shared reflector to an intermediate duty will be described. The duty of the electrode fingers is a ratio occupied by the electrode finger (the width of the electrode finger) in the pitch of the electrode fingers.

Figure 13:
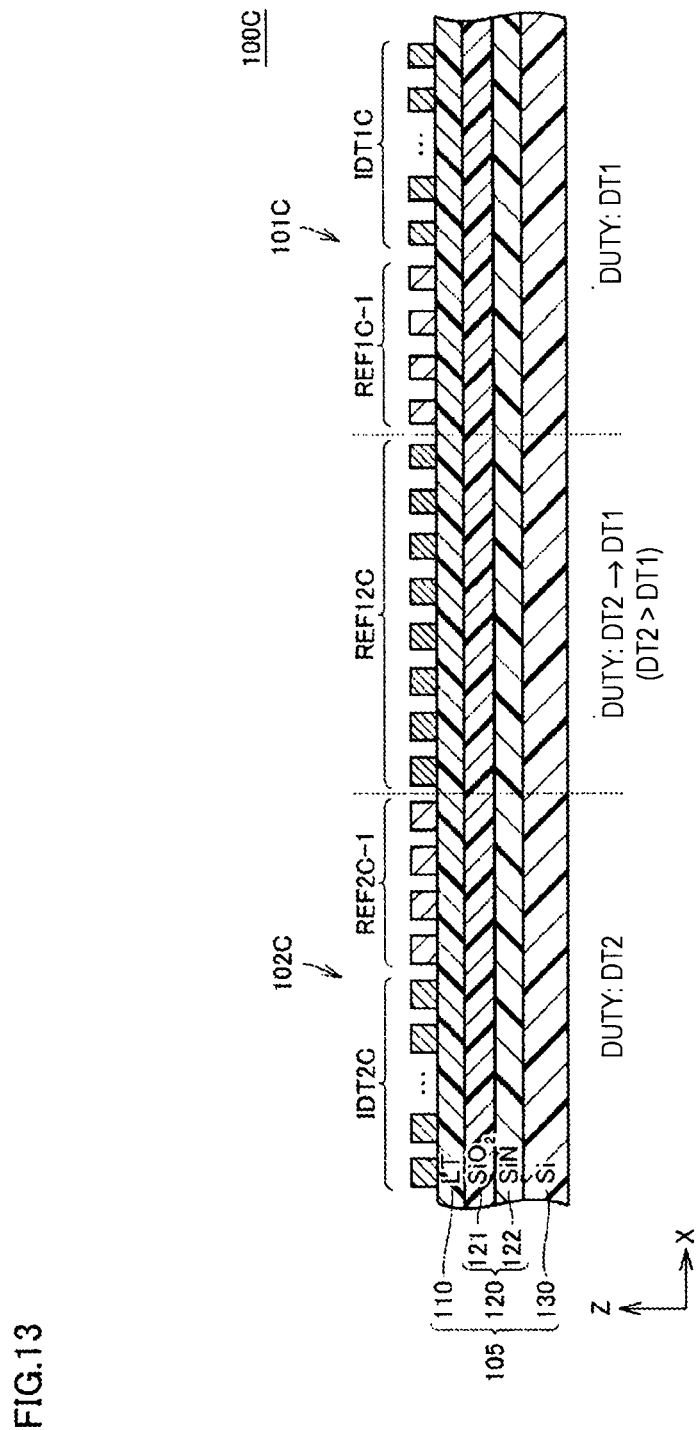
FIG. 13 is a cross-sectional view of an acoustic wave device according to a second preferred embodiment of the present invention.

FIG. 13 is a cross-sectional view of an acoustic wave device 100C according to the second preferred embodiment. The acoustic wave device 100C includes acoustic wave resonators 101C, 102C, and a shared reflector REF12C disposed between the acoustic wave resonators 101C, 102C.

The shared reflector REF12C is disposed between a reflector REF1C-1 disposed on one side of the interdigital transducer electrode IDT1C of the acoustic wave resonator 101C and a reflector REF2C-1 disposed on one side of the interdigital transducer electrode IDT2C of the acoustic wave resonator 102C. In the acoustic wave device 100C, the electrode finger pitch of the acoustic wave resonator 101C and the electrode finger pitch of the acoustic wave resonator 102C are the same pitch.

The duty (first duty) of the electrode fingers of each of an interdigital transducer electrode and reflectors in the acoustic wave resonator 101C is set to DT1, and the duty (second duty) of the electrode fingers of an interdigital transducer electrode and reflectors in the acoustic wave resonator 102C is set to DT2 (DT2>DT1). At least a portion of the electrode fingers in the shared reflector REF12C are formed with an intermediate duty between the first duty DT1 and the second duty DT2. Preferably, the duty of the electrode fingers of the shared reflector REF12C is set so as to increase gradually or in a stepwise manner from the acoustic wave resonator 101C toward the acoustic wave resonator 102C.

In this way, when the duties of the electrode fingers in adjacent acoustic wave resonators are different from each other, the frequency characteristics of the shared reflector is able to be set to frequency characteristics between the frequency characteristics of the two acoustic wave resonators by setting at least a portion of the electrode fingers of the shared reflector to an intermediate duty. Thus, as in the case of the first preferred embodiment, a reduction in the size of an acoustic wave device is achieved while a decrease in the frequency characteristics of the acoustic wave device is suppressed.

When both the pitches and duties of the electrode fingers in two acoustic wave resonators are different from each other, both the pitch and the duty of the electrode fingers in the shared reflector may be set to intermediate values.

FIG. 14 is a table showing an example of the specifications of the acoustic wave device 100C according to the second preferred embodiment. In the example, the number of pairs of the electrode fingers of the interdigital transducer electrode of each of resonator 1 and resonator 2 is 130, and the number of the electrode fingers is 261. The wave length (=(Pitch)×2) of each of resonator 1 and resonator 2 is 1.5495 μm. The number of the electrode fingers of the interdigital transducer of the shared reflector is eight, and the number of the electrode fingers of the interdigital transducer of the reflector disposed between the shared reflector and each interdigital transducer electrode is 10. The resonant frequency of resonator 1 is 2453.39 MHz, and the resonant frequency of resonator 2 is 2446.86 MHz. The film thickness of the electrode fingers of resonator 1 and the film thickness of the electrode fingers of resonator 2 are the same.

In the example, the duty of resonator 1 is set to 0.5, and the duty of resonator 2 is set to 0.55. The duty in the shared reflector gradually changes from 0.5 to 0.55 from resonator 1 toward resonator 2. In this way, by setting the duty of the shared reflector to an intermediate duty between the duties of the two resonators, a reduction in the size of an acoustic wave device is achieved while a decrease in the frequency characteristics of the acoustic wave device is suppressed. Since the electrode finger pitch and the electrode finger film thickness are the same between resonator 1 and resonator 2, the frequency of resonator 2 with a greater duty is lower than the frequency of resonator 1.

Third Preferred Embodiment

In a third preferred embodiment, the configuration in which, in the case of the configuration in which the film thickness of the electrode fingers of adjacent acoustic wave resonators are different from each other, the frequency characteristics of a shared reflector are adjusted by setting the film thickness of the electrode fingers of the shared reflector to an intermediate film thickness will be described.

Figure 15:
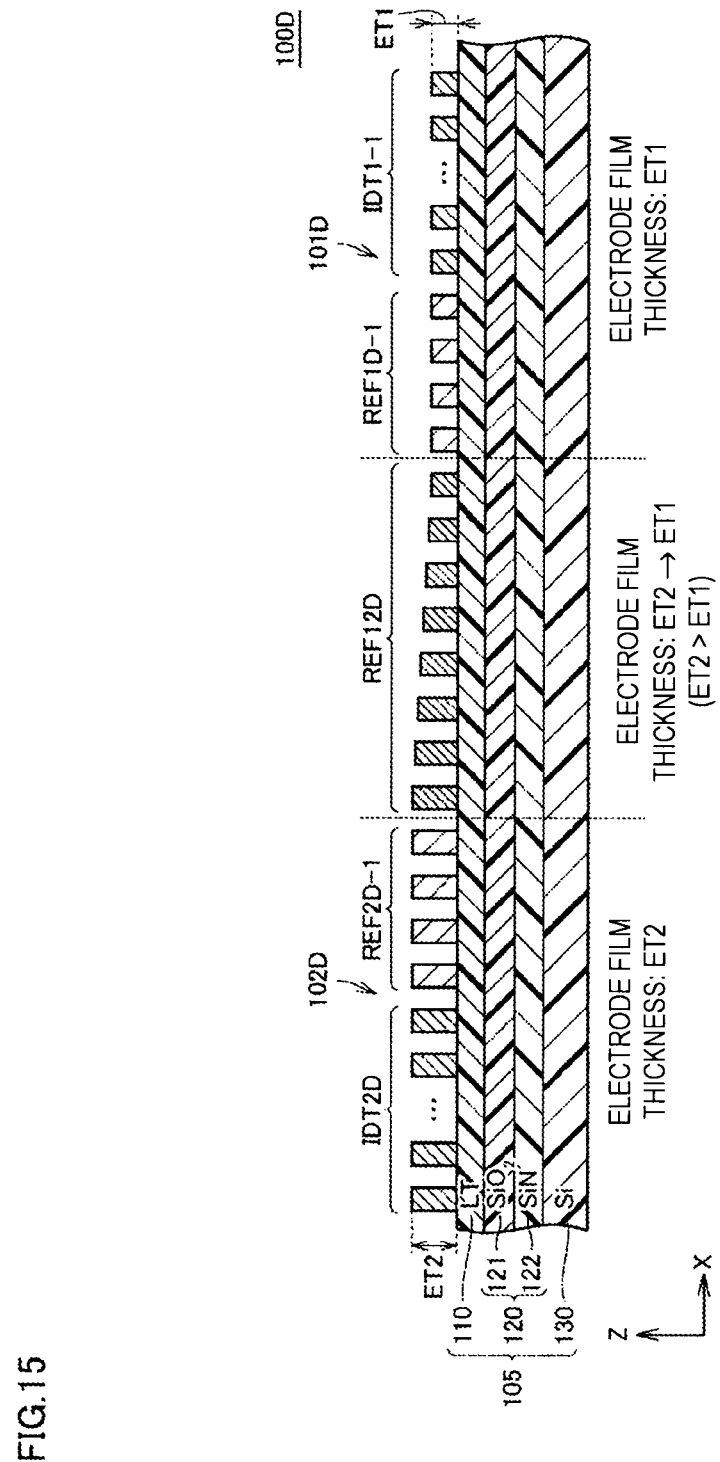
FIG. 15 is a cross-sectional view of an acoustic wave device according to a third preferred embodiment of the present invention.

FIG. 15 is a cross-sectional view of an acoustic wave device 100D according to the third preferred embodiment. The acoustic wave device 100D includes acoustic wave resonators 101D, 102D, and a shared reflector REF12D disposed between the acoustic wave resonators 101D, 102D.

The shared reflector REF12D is disposed between a reflector REF1D-1 disposed on one side of the interdigital transducer electrode IDT1D of the acoustic wave resonator 101D and a reflector REF2D-1 disposed on one side of the interdigital transducer electrode IDT2D of the acoustic wave resonator 102D.

In the acoustic wave device 100D, the pitch and the duty of the electrode fingers of the acoustic wave resonator 101D are the same as the pitch and the duty of the electrode fingers of the acoustic wave resonator 102D, and the film thicknesses of the electrode fingers of the two acoustic wave resonators 101D, 102D are different from each other. Specifically, the film thickness of the electrode fingers (first electrode finger film thickness) of the acoustic wave resonator 101D is set to ET1, and the film thickness of the electrode fingers (second electrode finger film thickness) of the acoustic wave resonator 102D is set to ET2 (ET2>ET1.

The film thickness of at least a portion of the electrode fingers in the shared reflector REF12D is formed with an intermediate film thickness between the first electrode finger film thickness ET1 and the second electrode finger film thickness ET2. In other words, the film thickness of at least a portion of the electrode fingers in the shared reflector REF12D is thicker than the first electrode finger film thickness ET1 and thinner than the second electrode finger film thickness ET2. Preferably, the film thickness of the electrode fingers of the shared reflector REF12D is set so as to increase gradually or in a stepwise manner from the acoustic wave resonator 101D toward the acoustic wave resonator 102D.

In this way, when the film thicknesses of the electrode fingers in adjacent acoustic wave resonators are different from each other, the frequency characteristics of the shared reflector is able to be set to frequency characteristics between the frequency characteristics of the two acoustic wave resonators by setting at least a portion of the electrode fingers of the shared reflector to an intermediate film thickness. Thus, as in the case of the first preferred embodiment, a reduction in the size of an acoustic wave device is achieved while a decrease in the frequency characteristics of the acoustic wave device is suppressed.

When the pitches and/or duties of the electrode fingers are different from each other in addition to the film thicknesses of the electrode fingers in two acoustic wave resonators, the pitch and/or the duty of the electrode fingers in the shared reflector may be set to an intermediate value.

FIG. 16 is a table showing an example of the specifications of the acoustic wave device 100D according to the third preferred embodiment. In the example, the number of pairs of the electrode fingers of the interdigital transducer electrode of resonator 1 is 130, and the number of the electrode fingers is 261. On the other hand, the number of pairs of the electrode fingers of the interdigital transducer electrode of resonator 2 is 90, and the number of the electrode fingers is 181. The wave length (=(Pitch)×2) of each of resonator 1 and resonator 2 is 1.5495 µm. The number of the electrode fingers of the interdigital transducer of the shared reflector is eight, and the number of the electrode fingers of the interdigital transducer of the reflector disposed between the shared reflector and each interdigital transducer electrode is 10. The resonant frequency of resonator 1 is 2453.39 MHz, and the resonant frequency of resonator 2 is 2442.24 MHz. In each of resonator 1 and resonator 2, the duty of the interdigital transducer electrode is 0.5.

In the example, the film thickness of the electrode fingers in resonator 1 is set to 121 nm, and the film thickness of the electrode fingers in resonator 2 is set to 131 nm. The film thickness of the electrode fingers gradually increases from 121 nm to 131 nm from resonator 1 toward resonator 2. In this way, by setting the electrode finger film thickness in the shared reflector to an intermediate film thickness between the electrode finger film thicknesses of the two resonators, a reduction in the size of an acoustic wave device is achieved while a decrease in the frequency characteristics of the acoustic wave device is suppressed. Since the pitch and duty of the electrode fingers are the same between resonator 1 and resonator 2, the frequency of resonator 2 with a greater electrode finger film thickness is lower than the frequency of resonator 1.

Fourth Preferred Embodiment

In an acoustic wave device, a dielectric layer can be disposed on an interdigital transducer electrode and reflectors to protect functional elements on a substrate. The frequency characteristics of an acoustic wave resonator also change depending on the thickness of the dielectric layer for protection.

In a fourth preferred embodiment, the configuration in which, when the film thickness of a dielectric layer for protection is different between adjacent acoustic wave resonators, the frequency characteristics of a shared reflector are adjusted by setting the film thickness of the dielectric layer to an intermediate film thickness will be described.

Figure 17:
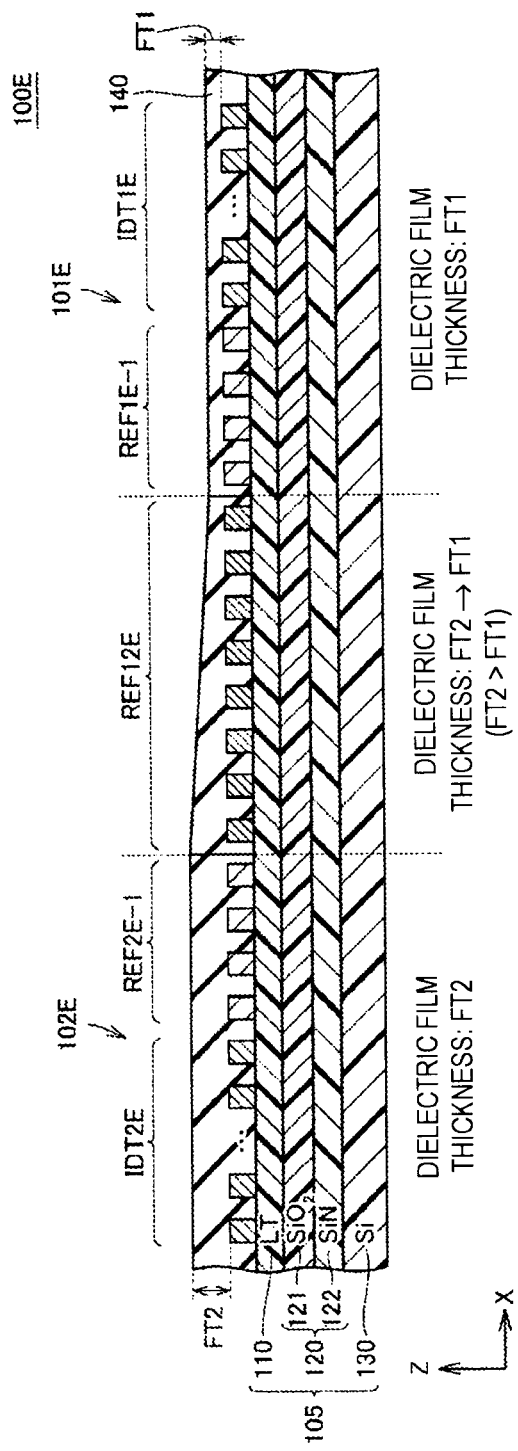
FIG. 17 is a cross-sectional view of an acoustic wave device according to a fourth preferred embodiment of the present invention.

FIG. 17 is a cross-sectional view of an acoustic wave device 100E according to the fourth preferred embodiment. The acoustic wave device 100E includes acoustic wave resonators 101E, 102E, a shared reflector REF12E disposed between the acoustic wave resonators 101E, 102E, and a dielectric layer 140 disposed on the acoustic wave resonators 101E, 102E and the shared reflector REF12E.

The shared reflector REF12E is disposed between a reflector REF1E-1 disposed on one side of the interdigital transducer electrode IDT1E of the acoustic wave resonator 101E and a reflector REF2E-1 disposed on one side of the interdigital transducer electrode IDT2E of the acoustic wave resonator 102E. In the acoustic wave device 100E, the pitch, duty, and film thickness of the electrode fingers of each of the interdigital transducer electrodes and reflectors of the acoustic wave resonators 101E, 102E and the shared reflector REF12E are set to the same values.

The dielectric layer 140 is, for example, a material, such as silicon dioxide, glass, silicon oxynitride, tantalum oxide, silicon nitride, aluminum nitride, aluminum oxide (alumina), silicon oxynitride, silicon carbide, diamondlike carbon (DLC), and diamond, and may be made of a chemical compound or the like of silicon dioxide added with fluorine, carbon, boron, or the like. The dielectric layer 140 is disposed so as to cover functional elements (the interdigital transducer electrode and the reflectors) disposed on the piezoelectric layer 110 of the substrate 105. The film thickness (first dielectric layer film thickness) of the dielectric layer 140 disposed in a region of the acoustic wave resonator 101E is set to FT1, and the film thickness (second dielectric layer film thickness) of the dielectric layer 140 disposed in a region of the acoustic wave resonator 102E is set to FT2 (FT1<FT2). When the dielectric layer 140 is made of a material (such as silicon dioxide, glass, tantalum oxide, niobium oxide, and tellurium oxide) having a bulk wave acoustic velocity lower than the acoustic velocity of the resonant frequency of the acoustic wave resonator, the mass at the time of vibration of the electrode fingers increases as the dielectric layer disposed on the electrode fingers thickens, so the resonant frequency of the resonator decreases. For this reason, in the configuration of FIG. 17, the resonant frequency of the acoustic wave resonator 102E is lower than the resonant frequency of the acoustic wave resonator 101E.

On the other hand, when the dielectric layer 140 is made of a material (such as glass, silicon nitride, aluminum nitride, alumina, silicon oxynitride, silicon carbide, DLC, and diamond) having a bulk wave acoustic velocity higher than the acoustic velocity of the resonant frequency of the acoustic wave resonator, the resonant frequency of the resonator increases as the dielectric layer thickness.

Figure 18:
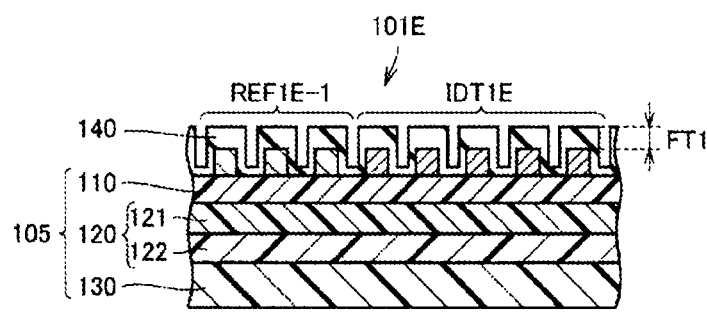
FIG. 18 is a diagram showing another example of arrangement of a dielectric layer.

In the fourth preferred embodiment, the film thicknesses FT1, FT2 of the dielectric layer 140 each are defined as a distance from the top surface of the electrode fingers of each of the interdigital transducer electrode and the reflectors to the surface of the dielectric layer 140. In addition, as shown in FIG. 18, the dielectric layer 140 may be configured such that the position of the top surface of a dielectric at a portion where the electrode finger is provided and the position of the top surface of a dielectric at a portion where the electrode finger is not provided are different from each other.

The film thickness of at least a portion of the dielectric layer 140 disposed in the region of the shared reflector REF12E is formed with an intermediate film thickness between the first dielectric layer film thickness FT1 and the second dielectric layer film thickness FT2. In other words, the film thickness of at least a portion of the dielectric layer 140 disposed in the region of the shared reflector REF12E is thinner than the first dielectric layer film thickness FT1 and thicker than the second dielectric layer film thickness FT2. Preferably, the film thickness of the dielectric layer 140 disposed in the region of the shared reflector REF12E is set so as to reduce gradually or in a stepwise manner from the acoustic wave resonator 101E toward the acoustic wave resonator 102E.

In this way, when the film thicknesses of the dielectric layers for protection disposed in the region of adjacent acoustic wave resonators are different from each other, the frequency characteristics of the shared reflector is able to be set to frequency characteristics between the frequency characteristics of the two acoustic wave resonators by setting at least a portion of the dielectric layer disposed in the region of the shared reflector to an intermediate film thickness. Thus, as in the case of the first preferred embodiment, a reduction in the size of an acoustic wave device is achieved while a decrease in the frequency characteristics of the acoustic wave device is suppressed.

When the pitches, duties, and/or film thicknesses of the electrode fingers are different in addition to the film thicknesses of the dielectric layer in two acoustic wave resonators, the pitch, duty, and/or film thickness of the electrode fingers in the shared reflector may also be set to an intermediate value.

Generally, the resonant frequency of a resonator, the frequencies (the upper limit frequency and the lower limit frequency) of a stop band, and the frequencies (the upper limit frequency and the lower limit frequency) of a reflector exhibit a similar dependence tendency for parameters, that is, the pitch of the electrode fingers, the duty of the electrode fingers, the thickness of the electrode fingers, the thickness of the piezoelectric layer, and the thickness of the dielectric layer. As described above, as the parameters, that is, the pitch of the electrode fingers, the duty of the electrode fingers, and the thickness of the electrode fingers, increase, the resonant frequency of each resonator tends to decrease. For this reason, where values obtained by multiplying the pitch of the electrode fingers, the duty of the electrode fingers, and the thickness of the electrode fingers (=(Electrode Finger Pitch)×(Electrode Finger Duty)×(Electrode Finger Thickness)) for the shared reflector REF12 (REF12C, REF12D, REF12E) and the acoustic wave resonators 101 (101C, 101D, 101E), 102 (102C, 102D, 102E) are respectively a first value, a second value, and a third value, the first value of the shared reflector REF12 is set between the second value of the acoustic wave resonator 101 and the third value of the acoustic wave resonator 102.

Furthermore, when a dielectric layer that covers the acoustic wave resonator 101, the acoustic wave resonator 102, and the shared reflector REF12 and that is made of a material having a bulk wave acoustic velocity lower than the acoustic velocity of the resonant frequency of each acoustic wave resonator is provided, the resonant frequency of each resonator tends to decrease as the thickness of the dielectric layer increases. For this reason, where values obtained by multiplying the pitch of the electrode fingers, the duty of the electrode fingers, the thickness of the electrode fingers, and the thickness of the dielectric layer (=(Electrode Finger Pitch)×(Electrode Finger Duty)×(Electrode Finger Thickness)×(Dielectric Layer Thickness)) for the shared reflector REF12 and the acoustic wave resonators 101, 102 are respectively a fourth value, a fifth value, and a sixth value, the fourth value of the shared reflector REF12 is set between the fifth value of the acoustic wave resonator 101 and the sixth value of the acoustic wave resonator 102.

Alternatively, when a dielectric layer that covers the acoustic wave resonator 101, the acoustic wave resonator 102, and the shared reflector REF12 and that is made of a material having a bulk wave acoustic velocity higher than the acoustic velocity of the resonant frequency of each acoustic wave resonator is provided, the resonant frequency of each resonator tends to increase as the thickness of the dielectric layer increases. For this reason, where values obtained by multiplying the pitch of the electrode fingers, the duty of the electrode fingers, the thickness of the electrode fingers, and an inverse number of the thickness of the dielectric layer (=(Electrode Finger Pitch)×(Electrode Finger Duty)×(Electrode Finger Thickness)/(Dielectric Layer Thickness)) for the shared reflector REF12 and the acoustic wave resonators 101, 102 are respectively a seventh value, an eighth value, and a ninth value, the seventh value of the shared reflector REF12 is set between the eighth value of the acoustic wave resonator 101 and the ninth value of the acoustic wave resonator 102.

For the relationship among the first value to the third value, the fourth value to the sixth value, and the seventh value to the ninth value holds, a range in which the parameters substantially linearly change needs to be used, so the condition that the duty of each acoustic wave resonator is less than or equal to 0.65 is needed.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
    a substrate including a piezoelectric layer;
    a first resonator on the substrate;
    a second resonator on the substrate adjacent to the first resonator and having different frequency characteristics than the first resonator; and
    a shared reflector on the substrate between the first resonator and the second resonator and defining a reflector for both the first resonator and the second resonator; wherein
    the first resonator includes a first interdigital transducer electrode including electrode fingers positioned with a first pitch;
    the second resonator includes a second interdigital transducer electrode including electrode fingers positioned with a second pitch;
    a lower limit frequency of a stop band of the shared reflector is equal to both a lower limit frequency of a stop band of the first resonator and a lower limit frequency of a stop band of the second resonator, or between the lower limit frequency of the stop band of the first resonator and the lower limit frequency of the stop band of the second resonator; and
    an upper limit frequency of the stop band of the shared reflector is equal to both an upper limit frequency of the stop band of the first resonator and an upper limit frequency of the stop band of the second resonator, or between the upper limit frequency of the stop band of the first resonator and the upper limit frequency of the stop band of the second resonator.

2. The acoustic wave device according to claim 1, wherein the second pitch is narrower than the first pitch; and
the shared reflector includes electrode fingers;
at least some of the electrode fingers of the shared reflector are positioned with a pitch between the first pitch and the second pitch.

3. The acoustic wave device according to claim 2, wherein the pitch of the electrode fingers of the shared reflector narrows gradually from the first resonator toward the second resonator.

4. The acoustic wave device according to claim 2, wherein the pitch of the electrode fingers of the shared reflector narrows in a stepwise manner from the first resonator toward the second resonator.

5. The acoustic wave device according to claim 1, wherein a duty of the electrode fingers in the first resonator is a first duty, and a duty of the electrode fingers in the second resonator is a second duty greater than the first duty;
the shared reflector includes electrode fingers; and
at least a portion of the electrode fingers of the shared reflector are positioned with a duty between the first duty and the second duty.

6. The acoustic wave device according to claim 5, wherein the duty of the electrode fingers of the shared reflector increases gradually from the first resonator toward the second resonator.

7. The acoustic wave device according to claim 5, wherein the duty of the electrode fingers of the shared reflector increases in a stepwise manner from the first resonator toward the second resonator.

8. The acoustic wave device according to claim 1, wherein
a thickness of the electrode fingers of the first resonator is thinner than a thickness of the electrode fingers of the second resonator; and
a thickness of at least a portion of electrode fingers of the shared reflector is thicker than the thickness of the electrode fingers of the first resonator and thinner than the thickness of the electrode fingers of the second resonator.

9. The acoustic wave device according to claim 1, further comprising:
a dielectric layer on the first resonator, the second resonator, and the shared reflector; wherein
a thickness of the dielectric layer in a region of the first resonator is thicker than a thickness of the dielectric layer in a region of the second resonator; and
at least a portion of the dielectric layer in a region of the shared reflector is thinner than the thickness of the dielectric layer in the region of the first resonator and thicker than the thickness of the dielectric layer in the region of the second resonator.

10. The acoustic wave device according to claim 1, wherein
each of the first resonator and the second resonator includes:
a first reflector between the shared reflector and the interdigital transducer electrode included in the first and second resonators; and
a second reflector at an end portion across the interdigital transducer electrode from the first reflector;
electrode fingers of the first reflector of the first resonator are positioned with the first pitch; and
electrode fingers of the first reflector of the second resonator are positioned with the second pitch.

11. The acoustic wave device according to claim 10, wherein a sum of a number of the electrode fingers of the first reflector and a number of electrode fingers of the shared reflector is the same as a number of electrode fingers of the second reflector.

12. The acoustic wave device according to claim 1, wherein a length of electrode fingers of the shared reflector is greater than or equal to an overlap width of the electrode fingers in the interdigital transducer electrode of each of the first and second resonators.

13. The acoustic wave device according to claim 1, wherein a first imaginary line that passes through a center of an overlap width of the first interdigital transducer electrode and that is orthogonal to the electrode fingers of the first interdigital transducer electrode does not overlap a second imaginary line that passes through a center of an overlap width of the second interdigital transducer electrode and that is orthogonal to the electrode fingers of the second interdigital transducer electrode.

14. The acoustic wave device according to claim 10, wherein
each of the first and second interdigital transducer electrodes, the shared reflector, the first and second reflector of the first resonator, and the first and second reflectors of the second resonator includes a busbar to which corresponding electrode fingers are connected; and
in each of the first and second interdigital transducer electrodes, the shared reflector, the first and second reflector of the first resonator, and the first and second reflectors of the second resonator, an angle between each of the corresponding electrode fingers and the busbar is larger than 0° and smaller than 90°.

15. The acoustic wave device according to claim 1, wherein the substrate further includes a reflection layer on which the piezoelectric layer is provided.

16. A ladder filter comprising:
the acoustic wave device according to claim 1;
a plurality of series arm resonators including the first resonator; and
a plurality of parallel arm resonators including the second resonator; wherein
the plurality of series arm resonators further includes a third resonator narrower in a pitch of electrode fingers than the first resonator.

17. A ladder filter comprising:
the acoustic wave device according to claim 1;
a plurality of series arm resonators including the first resonator; and
a plurality of parallel arm resonators including the second resonator, wherein
the plurality of parallel arm resonators further includes a fourth resonator wider in a pitch of electrode fingers than the second resonator.

18. An acoustic wave device comprising:
a substrate including a piezoelectric layer;
a first resonator on the substrate;
a second resonator on the substrate adjacent to the first resonator and having frequency characteristics different from frequency characteristics of the first resonator; and
a shared reflector on the substrate between the first resonator and the second resonator and defining a reflector for both the first resonator and the second resonator; wherein the first resonator includes a first interdigital transducer electrode including electrode fingers positioned with a first pitch;

the second resonator includes a second interdigital transducer electrode including electrode fingers positioned with a second pitch; and where values obtained by multiplying a pitch of electrode fingers, a duty of the electrode fingers, and a thickness of the electrode fingers for the shared reflector, the first resonator, and the second resonator are respectively a first value, a second value, and a third value, the first value is the same as both the second value and the third value or between the second value and the third value.

19. The acoustic wave device according to claim 18, further comprising:

a dielectric layer covering the first resonator, the second resonator, and the shared reflector; wherein the dielectric layer is made of a material having a bulk wave acoustic velocity lower than an acoustic velocity of a resonant frequency of each of the first resonator and the second resonator; and where values obtained by multiplying the pitch of the electrode fingers, the duty of the electrode fingers, the thickness of the electrode fingers, and a thickness of the dielectric layer for the shared reflector, the first resonator, and the second resonator are respectively a fourth value, a fifth value, and a sixth value, the fourth value is the same as both the fifth value and the sixth value or between the fifth value and the sixth value.

20. The acoustic wave device according to claim 18, further comprising:

a dielectric layer covering the first resonator, the second resonator, and the shared reflector; wherein the dielectric layer is made of a material having a bulk wave acoustic velocity higher than an acoustic velocity of a resonant frequency of each of the first resonator and the second resonator; and where values obtained by multiplying the pitch of the electrode fingers, the duty of the electrode fingers, the thickness of the electrode fingers, and an inverse number of a thickness of the dielectric layer for the shared reflector, the first resonator, and the second resonator are respectively a seventh value, an eighth value, and a ninth value, the seventh value is the same as both the eighth value and the ninth value or between the eighth value and the ninth value.

* * * * *